US012628344B2

(12) United States Patent (10) Patent No.: US 12,628,344 B2

Hwang (45) Date of Patent: May 12, 2026

(54) MEMORY DEVICE AND METHOD OF MANUFACTURING MEMORY DEVICE

(71) Applicant: SK hynix Inc., Icheon-si (KR)

(72) Inventor: Hyun Mi Hwang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 369 days.

(21) Appl. No.: 18/361,509

(22) Filed: Jul. 28, 2023

(65) Prior Publication Data

US 2024/0260269 A1 Aug. 1, 2024

(30) Foreign Application Priority Data

Jan. 30, 2023 (KR) ........................ 10-2023-0012065

(51) Int. Cl.
| | |
|---|---|
| *H10B 43/27* | (2023.01) |
| *H10B 41/27* | (2023.01) |
| *H10B 41/35* | (2023.01) |
| *H10B 43/35* | (2023.01) |

(52) U.S. Cl.
CPC ............. *H10B 43/27* (2023.02); *H10B 41/27* (2023.02); *H10B 41/35* (2023.02); *H10B 43/35* (2023.02)

(58) Field of Classification Search
CPC ........ H10B 43/27; H10B 43/35; H10B 41/35; H10B 41/27
See application file for complete search history.

(56) References Cited

U.S. PATENT DOCUMENTS

| | | | | |
|---|---|---|---|---|
| 8,759,921 | B2 * | 6/2014 | Seo ...................... | H10D 30/693 |
| | | | | 257/390 |
| 2022/0123005 | A1 * | 4/2022 | Lee ........................ | H10B 41/10 |
| 2022/0157849 | A1 * | 5/2022 | Lee ........................ | H10B 41/27 |

FOREIGN PATENT DOCUMENTS

| | | |
|---|---|---|
| KR | 101487082 B1 | 1/2015 |
| KR | 1020170095801 A | 8/2017 |

OTHER PUBLICATIONS

"Role of process-induced wafer geometry changes in advanced semiconductor manufacturing", Oct. 2014, URL: https://siliconsemiconductor.net/article/95474/Role_of_process-induced_wafer_geometry_changes_in_advanced_semiconductor_manufacturing/feature.

Chuen-Lin Tien et al., "Thermal expansion coefficient and thermomechanical properties of SiNx thin films prepared by plasma-enhanced chemical vapor deposition", Optical Society of America, Oct. 2012.

Dandan Shi et al., "A novel solution to improve saddle-shape warpage in 3D NAND flash memory", Semiconductor Science and Technology 35 (2020) 045031 (6pp), Mar. 2020.

PWG5™: The Complete Wafer Geometry System for IC Fabs, Dec. 8, 2020, URL: https://www.kla-tencor.com/advance/innovation/pwg5-the-complete-wafer-geometry-system-for-ic-fabs.

* cited by examiner

*Primary Examiner* — Mary Ellen Bowman
(74) *Attorney, Agent, or Firm* — WILLIAM PARK AND ASSOCIATES LTD.

(57) ABSTRACT

There is provided a memory device and a method of manufacturing the memory device. The memory device includes: a wafer including a chip region and an edge region surrounding the chip region; a stack structure including a plurality of insulating layers and a plurality of conductive layers, which are alternately stacked over the chip region; a plurality of channel structures disposed in the stack structure; a first slit penetrating the plurality of insulating layers and the plurality of conductive layers; an upper insulating layer disposed over the edge region; and a plurality of second slits formed in a portion of the upper insulating layer.

8 Claims, 24 Drawing Sheets

SLT1

CS
CAP
ML
CH
CP

MEMORY DEVICE AND METHOD OF MANUFACTURING MEMORY DEVICE

CROSS-REFERENCE TO RELATED APPLICATION

The present application claims priority under 35 U.S.C. § 119(a) to Korean patent application number 10-2023-0012065 filed on Jan. 30, 2023, in the Korean Intellectual Property Office, the entire disclosure of which is incorporated by reference herein.

BACKGROUND

1. Technical Field

The present disclosure generally relates to a memory device and a method of manufacturing a memory device, and more particularly, to a three-dimensional memory device and a method of manufacturing a three-dimensional memory device.

2. Related Art

A memory device may be classified into a volatile memory device in which stored data disappears when the supply of power is interrupted and a nonvolatile memory device in which stored data is retained even when the supply of power is interrupted.

The nonvolatile memory device may include a NAND flash memory, a NOR flash memory, a resistive random access memory (ReRAM), a phase-change random access memory (PRAM), a magnetoresistive random access memory (MRAM), a ferroelectric random access memory (FRAM), a spin transfer torque random access memory (STT-RAM), and the like.

A NAND flash memory system may include a memory device configured to store data and a controller configured to control the memory device. The memory device may include a memory cell array in which data is stored and peripheral circuits configured to perform a program, read or erase operation in response to a command transmitted from the controller.

Material layers used in a semiconductor manufacturing process have intrinsic stress, and warpage may occur in a wafer due to stress induced by a material layer deposition process and an annealing process. When warpage occurs in a wafer, separation or cracks between material layers deposited on the wafer may occur. Therefore, the wafer may structurally become unstable, and the operational characteristic or reliability of a semiconductor device may deteriorate.

SUMMARY

In accordance with an embodiment of the present disclosure, there may be provided a memory device including: a wafer including a chip region and an edge region surrounding the chip region; a stack structure including a plurality of insulating layers and a plurality of conductive layers, which are alternately stacked over the chip region; a plurality of channel structures disposed in the stack structure; a first slit penetrating the plurality of insulating layers and the plurality of conductive layers; an upper insulating layer disposed over the edge region; and a plurality of second slits formed in a portion of the upper insulating layer.

In accordance with an embodiment of the present disclosure, there may be provided a memory device including: a wafer including a chip region and an edge region surrounding the chip region; a stack structure including a plurality of conductive layers and a plurality of insulating layers, which are alternately stacked over the chip region of the wafer, wherein the stack structure includes a stepped structure comprising end portions of the conductive layers and insulating layers, and wherein each step of the stepped structure includes a pad part including a conductive layer from the plurality of conductive layers and an insulating layer from the plurality insulating layers; a plurality of channel structures disposed in the stack structure; an upper insulating layer formed over the stack structure to cover the stepped structure, the upper insulating layer extending onto the edge region of the wafer; a plurality of contact structures in contact with the plurality of pad parts while being formed in a portion of the upper insulating layer overlapping with the plurality of pad parts; and a slit formed in a portion of the upper insulating layer, the slit overlapping with the edge region of the wafer.

In accordance with an embodiment of the present disclosure, there may be provided a method of manufacturing a memory device, the method including: providing a wafer including a chip region and an edge region surrounding the chip region; forming a stack structure in which a plurality of first material layers and a plurality of second material layers are alternately stacked over the chip region of the wafer; forming a stepped structure by forming a plurality of pad parts by etching portions of the plurality of first material layers and the plurality of second material layers; forming an insulating layer covering the plurality of pad parts, the insulating layer covering at least a portion of the edge region; forming a first slit extending in a vertical direction in the stack structure; and forming a plurality of second slits in the insulating layer.

BRIEF DESCRIPTION OF THE DRAWINGS

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 3A is a sectional view of a memory device taken along line A-A' shown in FIG. 2 in accordance with an embodiment of the present disclosure.

FIGS. 7A, 7B, 7C, 7D, 7E, 7F, 7G, 7H, and 7I are sectional views illustrating a method of manufacturing a memory device taken along the line A-A' shown in FIG. 2 in accordance with an embodiment of the present disclosure.

DETAILED DESCRIPTION

The specific structural and functional descriptions disclosed herein are merely illustrative for the purpose of describing embodiments according to the concept of the present disclosure. The embodiments according to the concept of the present disclosure can be modified in various forms and replaced with other equivalent embodiments. Thus, the present disclosure should not be construed as limited to the embodiments set forth herein.

It will be understood that, although the terms "first," "second," etc. may be used herein to describe various elements, these elements should not be limited by these terms. These terms are only used to distinguish one element from another element, and the order or number of components is not limited by the terms. It will be understood that when an element or layer etc., is referred to as being "on," "connected to" or "coupled to" another element or layer etc., it can be directly on, connected or coupled to the other element or layer etc., or intervening elements or layers etc., may be present. In contrast, when an element or layer etc., is referred to as being "directly on," "directly connected to" or "directly coupled to" another element or layer etc., there are no intervening elements or layers etc., present. In some embodiments, it will be understood that when a structure or element etc., is referred to as penetrating another structure or element etc., it can partially penetrate the other structure or element etc., by extending into a portion of the other structure or element etc., or completely penetrate the other structure or element etc., by passing through the entire structure or element etc.

Embodiments provide a memory device and a method of manufacturing a memory device, which can suppress warpage of a wafer.

Figure 1:
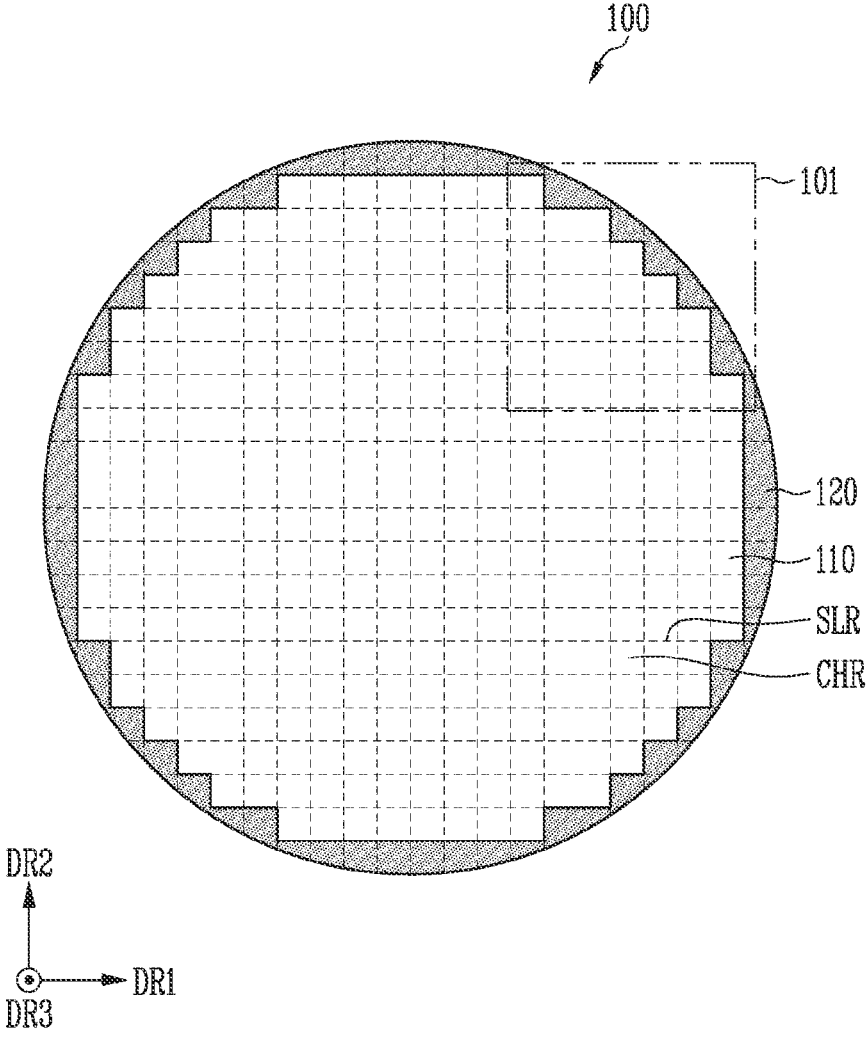
FIG. 1 is a view illustrating a wafer in accordance with an embodiment of the present disclosure.

FIG. 1 is view illustrating a wafer in accordance with an embodiment of the present disclosure.

Referring to FIG. 1, the wafer 100 may include a chip region 110 and an edge region 120 surrounding the chip region 110. The wafer 100 may be a substrate formed of a semiconductor including silicon and the like. In an embodiment, the wafer 100 may include poly-silicon. The wafer may include a circuit and/or a line structure formed on the substrate. The circuit and/or the line structure may be formed by repeatedly performing a layer deposition process, a mask and etching process, an ion implantation process, and the like.

The chip region 110 is a region in which a plurality of semiconductor devices are integrated, and may include a plurality of unit chip regions CHR having a quadrangular shape on a plane. The plurality of unit chip regions CHR may be arranged in a matrix form along a first direction DR1 and a second direction DR2 intersecting the first direction DR1. The plurality of unit chip regions CHR may be disposed in the wafer 100 such that the area of the chip region 110 is maximized. Because each of the unit chip regions CHR has the quadrangular shape, the outline of the chip region 110 may have a shape formed with combinations of lines in the first direction DR1 and lines in the second direction DR2. On the other hand, the wafer 100 may have a circular shape or a shape similar thereto. Therefore, the chip region 110 is not entirely filled in the wafer 100, and hence a region remaining at the outside of the chip region 110 exists. This region remaining at the outside of the chip region 110 is defined as the edge region 120 hereinbelow. For example, in an embodiment, the edge region 120 may surround the chip region 110 as shown in FIG. 1.

The wafer 100 may include a plurality of unit chip regions CHR and a scribe line region SLR traversing between the unit chip regions CHR. Each of the unit chip regions CHR may be surrounded by the scribe line region SLR. Semiconductor memory devices such as a Dynamic Random Access Memory (DRAM), a Static Random Access Memory (SRAM), a NAND flash memory, and a Resistive Random Access Memory (RRAM) may be provided on the unit chip regions CHR. Alternatively, a processor such as a Micro Electro Mechanical Systems (MEMS) device, an optoelectronic device, a CPU, or a DSP may be provided on the unit chip regions CHR. Alternatively, standard cells including semiconductor devices, such as a logic sum gate or a logic product gate, may be provided on the unit chip regions CHR. Redistribution chip pads for inputting/outputting data or a signal to/from semiconductor integrated circuits and redistribution pads for inputting/outputting a signal to test circuits may be connected to each of the unit chip regions CHR. Hereinafter, an embodiment of the present disclosure will be described based on that a NAND flash memory device is provided in the unit chip regions CHR. However, the embodiments of the present disclosure are not limited thereto.

The scribe line region SLR may extend in the first direction DR1 and the second direction DR2 between the unit chip regions CHR. Although not shown in the drawing, the scribe line region SLR may include a cutting region cut by a sawing or cutting machine and chip guard regions between the cutting region and the unit chip regions CHR.

Figure 2:
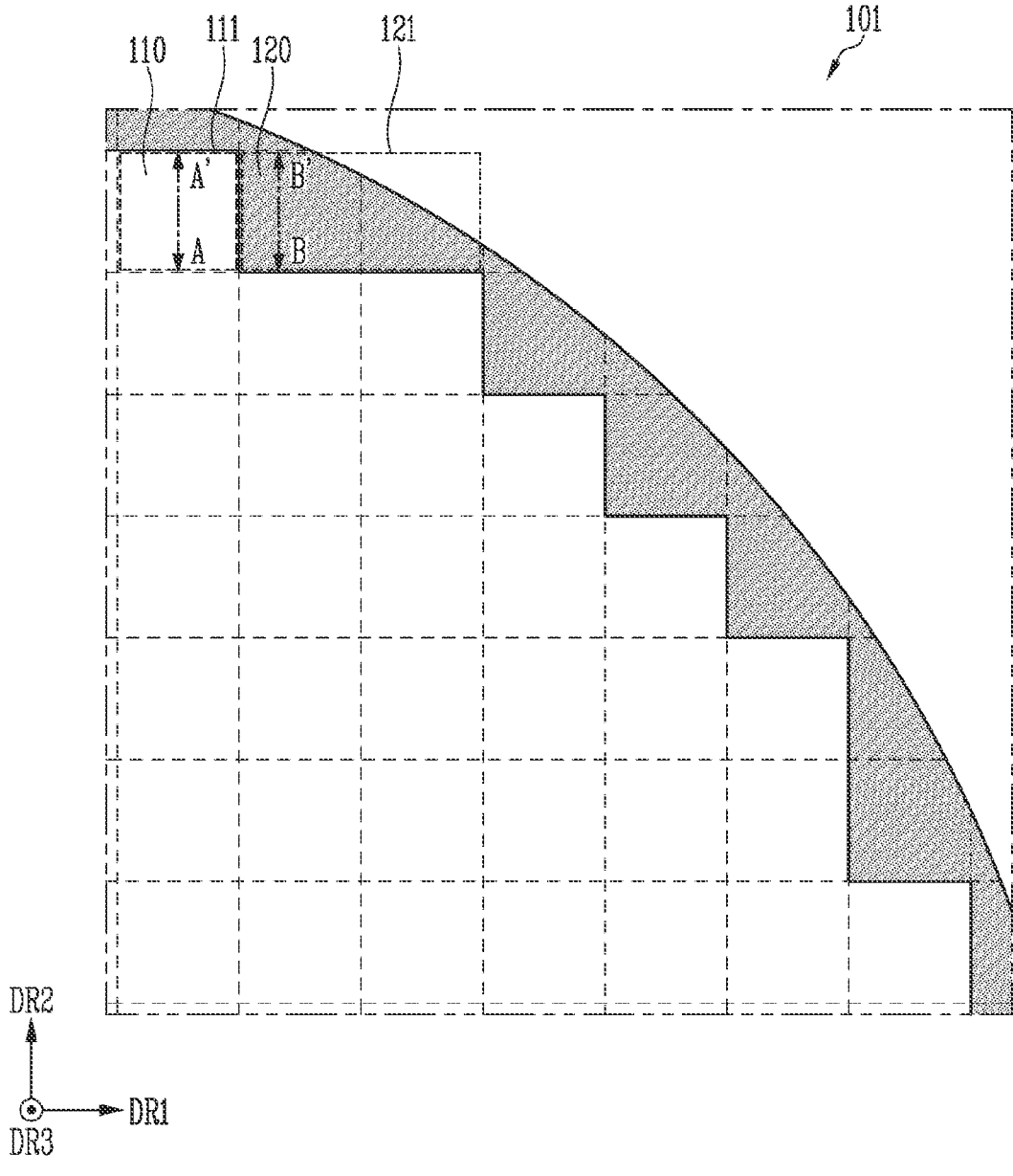
FIG. 2 is an enlarged view illustrating one region of the wafer shown in FIG. 1.

FIG. 2 is an enlarged view illustrating one region 101 of the wafer shown in FIG. 1.

Figure 3A:
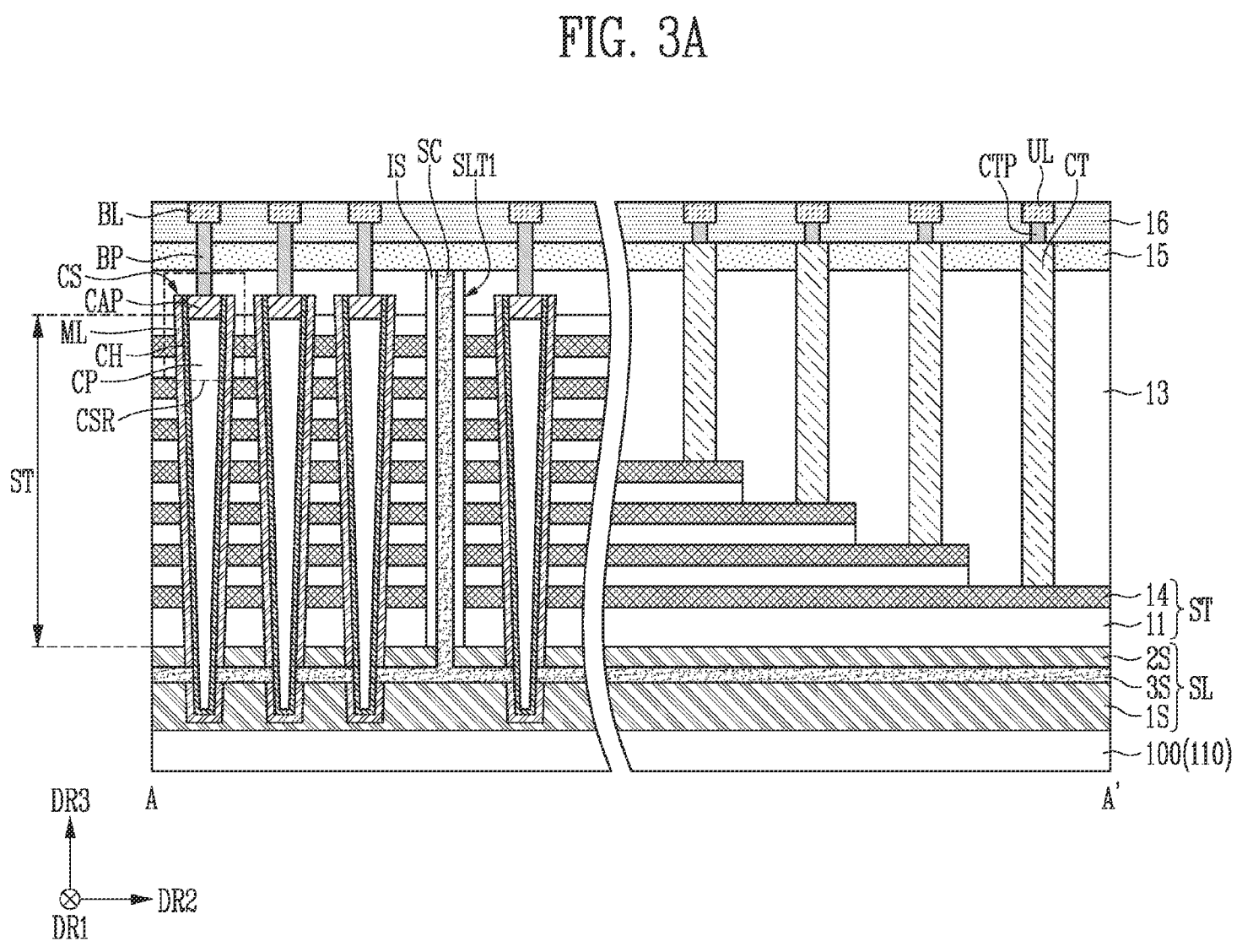
Figure 3B:
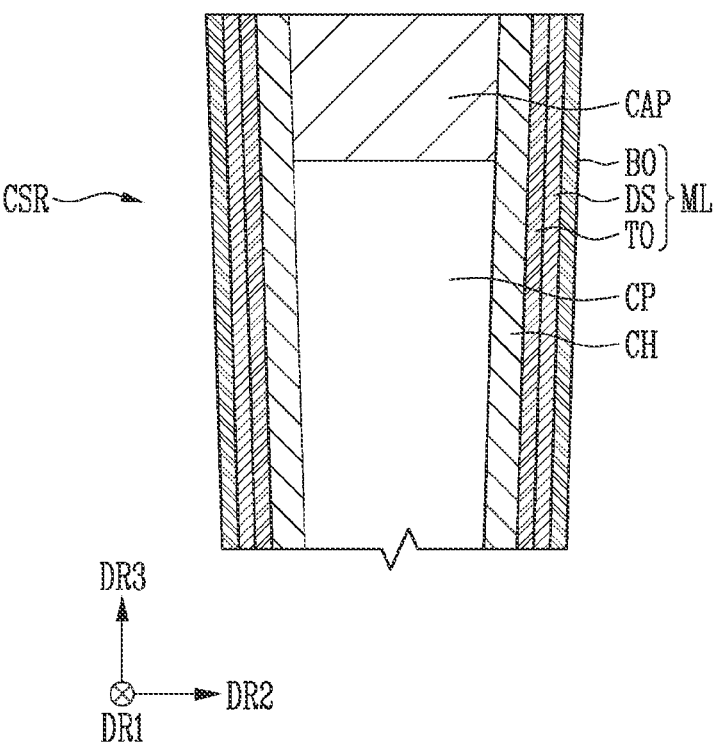
FIG. 3B is an enlarged view illustrating a channel structure region shown in FIG. 3A.

Referring to FIG. 2 the one region 101 of the wafer may include the chip region 110 and the edge region 120. For convenience, one of the unit chip regions CHR shown in FIG. 1 is designated as reference numeral 111. A sectional view of the unit chip region 111 taken along line A-A' in a third direction DR3 intersecting the first and second directions DR1 and DR2 is illustrated in FIGS. 3A and 3B. The first direction DR1 and the second direction DR2 may be defined as directions in which axes intersecting each other face on a plane parallel to a surface of the wafer, and the third direction DR3 may be defined as a vertical direction orthogonal to the surface of the wafer.

Figure 4A:
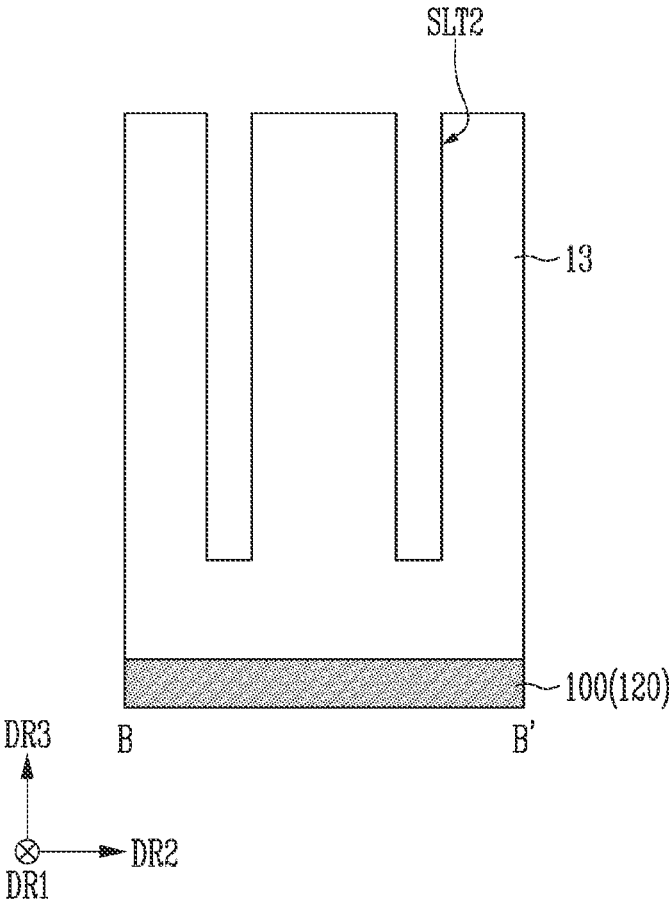
FIGS. 4A, 4B, and 4C are sectional views of a memory device taken along line B-B' shown in FIG. 2 in accordance with embodiments of the present disclosure.
Figure 4B:
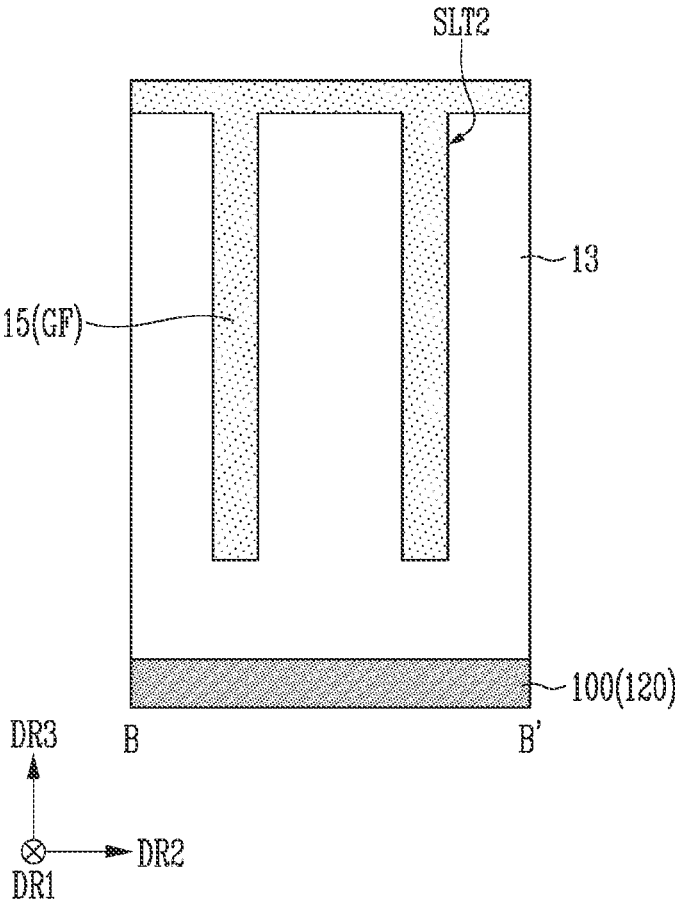
Figure 4C:
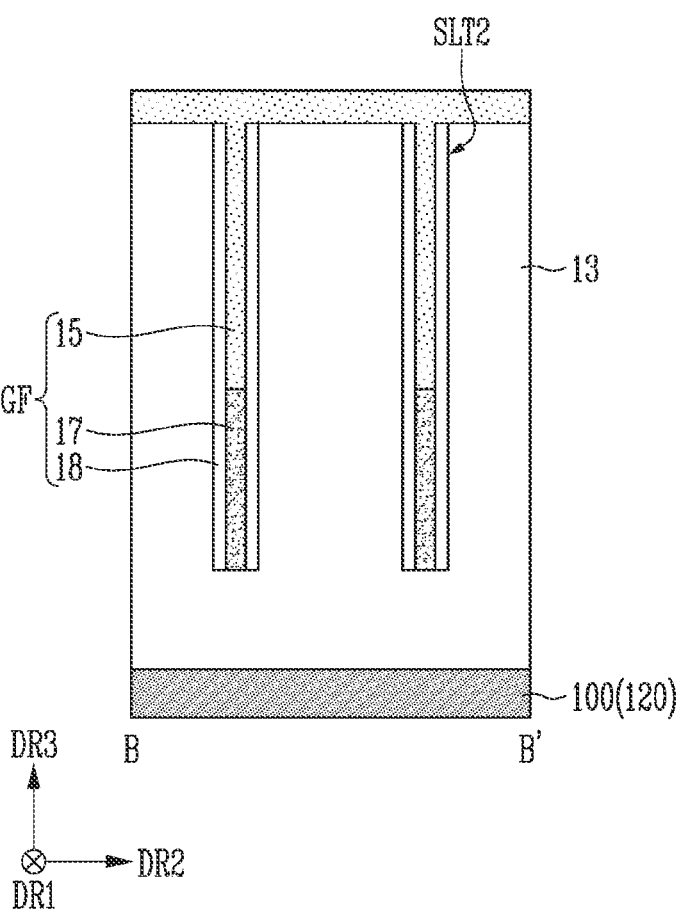

For convenience, a unit edge region adjacent to the unit chip region 111 in the first direction DR1 in the edge region 120 is designated as reference numeral 121. A sectional view of the unit edge region 121 taken along line B-B' in the third direction DR3 is illustrated in FIGS. 4A to 4C. In an embodiment, the unit edge region 121 is a section of less than all of the edge region 120 as shown in FIG. 2.

FIG. 3A is a sectional view of a memory device taken along the line A-A' shown in FIG. 2 in accordance with an embodiment of the present disclosure.

FIG. 3B is an enlarged view illustrating a channel structure region CSR shown in FIG. 3A.

Referring to FIG. 3A, a stack structure ST may be formed over the chip region 110 of the wafer 100. The stack structure ST may be disposed over a first surface of the wafer 100, which faces in the third direction DR3. The stack structure ST may include a plurality of insulating layers 11 stacked to be spaced apart from each other in the third direction DR3. The plurality of insulating layers 11 may extend in the second direction DR2. The stack structure ST may further include a plurality of conductive layers 14 alternately disposed with the plurality of insulating layers 11 in the third direction DR3.

A source layer SL may be disposed between the stack structure ST and the wafer 100. The source layer SL may extend in the second direction DR2 along the first surface of the wafer 100. The source layer SL may include a first source layer 1S and a second source layer 2S, and further include a third source layer 3S disposed between the first and second source layers 1S and 2S. Each of the first to third source layers 1S, 2S, and 3S may include a doped semiconductor layer including at least one of an n-type impurity and a p-type impurity. In an embodiment, each of the first to third source layers 1S, 2S, and 3S may include an n-type doped silicon layer.

A plurality of channel structures CS may be disposed inside the stack structure ST. The plurality of channel structure CS may extend in the third direction DR3. The plurality of channel structures CS may be disposed to be spaced apart from each other in the second direction DR2. The plurality of channel structures CS may extend to penetrate a portion of the source layer SL. In an embodiment, each channel structure CS may penetrate the second source layer 2S and the third source layer 3S, and extend to the inside of the first source layer 1S.

Each channel structure CS may include a memory layer ML, a channel layer CH, a core pillar CP, and a capping layer CAP. The core pillar CP may be formed on the bottom of the capping layer CAP. The core pillar CP may include an insulating material. The channel layer CH may extend along a sidewall of each of the capping layer CAP and the core pillar CP. The channel layer CH may be formed of a semiconductor material. In an embodiment, the channel layer CH may be formed of a silicon layer. The capping layer CAP may include a doped semiconductor layer including at least one of an n-type impurity and a p-type impurity. In an embodiment, the capping layer CAP may include an n-type doped semiconductor layer. The memory layer ML may extend along a sidewall of the channel layer CH. The channel layer CH may be in contact with the third source layer 3S. The third source layer 3S may penetrate a portion of the memory layer ML to be in contact with the channel layer CH.

Referring to FIG. 3B, the memory layer ML may include a tunnel insulating layer TO, a data storage layer DS, and a blocking layer BO. The tunnel insulating layer TO may extend along the sidewall of the channel layer CH. The tunnel insulating layer TO may include an insulating material. In an embodiment, the tunnel insulating layer TO may include an oxide layer such as a silicon oxide layer. The data storage layer DS may extend along a sidewall of the tunnel insulating layer TO. The data storage layer DS may include a material capable of storing data in various manners, including a charge trap layer, a variable resistance layer, a nano dot, and the like. In an embodiment, the data storage layer DS may be formed of a nitride layer capable of trapping charges. The blocking layer BO may extend along a sidewall of the data storage layer DS. The blocking layer BO may include an insulating material. In an embodiment, the blocking layer BO may be formed of an oxide layer such as a silicon oxide layer. The channel layer CH may be formed to surround the capping layer CAP and the core pillar CP, the tunnel insulating layer TO may be formed to surround the channel layer CH, the data storage layer DS may be formed to surround the tunnel insulating layer TO, and the blocking layer BO may be formed to surround the data storage layer DS.

Referring to FIG. 3A, a stepped structure may be formed by a plurality of pad parts constituting end portions of the plurality of insulating layers 11 and the plurality of conductive layers 14. An upper insulating layer 13 may be formed to cover the plurality of pad parts and the stack structure ST. A cover layer 15 may be formed over the upper insulating layer 13. The cover layer 15 may include an insulating material. In an embodiment, the cover layer 15 may include oxide. A plurality of contact structures CT may be formed to penetrate the cover layer 15 and the upper insulating layer 13. The plurality of contact structures CT may be in contact with the plurality of pad parts of the plurality of conductive layers 14, respectively. Specifically, one contact structure among the plurality of contact structures CT may be in contact with a pad part corresponding thereto among the pad parts of the plurality of conductive layers 14. Each contact structure CT may be connected to an upper line UL through a contact plug CTP. The contact structures CT, the contact plug CTP, and the upper line UL may be formed of various conductive materials. The contact plug CTP and the upper line UL may be formed in an isolation insulating layer 16. The isolation insulating layer 16 may be disposed over the top of the cover layer 15. The isolation insulating layer 16 may be formed as a single-layer or a multi-layer. In an embodiment, the isolation insulating layer 16 may include a first insulating layer on the cover layer 15 and a second insulating layer on the first insulating layer. The contact plug CTP may penetrate the first insulating layer at a level at which the first insulating layer is disposed, and the upper line UL may penetrate the second insulating layer at a level at which the second insulating layer is disposed. Although not shown in the drawing, an etch stop layer may be further included between the cover layer 15 and the upper insulating layer 13. In an embodiment, a nitride layer serving as the etch stop layer may be further formed between the cover layer 15 and the upper insulating layer 13. The upper line UL may extend to penetrate the etch stop layer.

A plurality of bit line plugs BP may be formed to penetrate the cover layer 15 and the upper insulating layer 13. Each bit line plug BP may be in contact with a corresponding channel structure among the plurality of channel structures CS. In an embodiment, each bit line plug BP may be in contact with a capping layer CAP of a corresponding channel structure CS. The plurality of channel structures CS may be connected to a plurality of bit lines BL through the plurality of bit line plugs BP. The plurality of bit line plugs BP may penetrate a portion of the isolation insulating layer 16. The bit line BL may be formed in the isolation insulating layer 16. The bit line plugs BP and the bit line BL may be formed of various conductive materials.

A first slit SLT1 may be disposed between the plurality of channel structures CS. The first slit SLT1 may extend in the third direction DR3. In an embodiment, the first slit SLT1 may include a source contact SC and a slit insulating layer IS. The source contact SC may be formed of various conductive materials including doped silicon, metal, metal silicide, and the like. The source contact SC may be in contact with the third source layer 3S while penetrating the second source layer 2S. The slit insulating layer IS may be disposed between the stack structure ST and the source contact SC. The first slit SLT1 may be formed to penetrate the upper insulating layer 13, the plurality of insulating layers 11, and the plurality of conductive layers 14. The plurality of insulating layers 11 and the plurality of conductive layers 14 may be partitioned for each stack structure ST by the first slit SLT1.

FIG. 4A to 4C are sectional views of a memory device taken along the line B-B' shown in FIG. 2 in accordance with embodiments of the present disclosure.

Referring to FIGS. 4A to 4C, the upper insulating layer 13 shown in FIG. 3A may extend onto the edge region 120 of the wafer 100. A plurality of second slits SLT2 may be formed in the upper insulating layer 13. The plurality of second slits SLT2 may be formed in a portion of the upper insulating layer 13. The plurality of second slits SLT2 may be disposed to be spaced apart from each other in the second direction DR2, and extend in the third direction DR3.

Referring to FIGS. 4B and 4C, a gap fill layer GF may be formed inside the plurality of second slits SLT2. The gap fill layer GF may include at least one of a conductive material and an insulating material. The plurality of second slits SLT2 may be formed through the same process as the first slit SLT1 shown in FIG. 3A as will be described later. Also, the plurality of second slits SLT2 may be simultaneously formed with the first slit SLT1 shown in FIG. 3A. Materials formed after the first slit SLT1 and the second slit SLT2 are formed may constitute the gap fill layer GF in the second slit SLT2. For example, the gap fill layer GF may include at least one of an insulating material for the slit insulating layer IS in the first slit SLT1 shown in FIG. 3A, a conductive material for the source contact SC in the first slit SLT1 shown in FIG. 3A and an insulating material for the cover layer 15 shown in FIG. 3A. Some of the material layers formed on the chip region 110 of the wafer 100, which is shown in FIG. 3A, may be disposed on the edge region 120 of the wafer 100. Deposition thicknesses of the material layers on the edge region 120 of the wafer and the material layers on the chip region 110 of the wafer 100, which is shown in FIG. 3A, may be different from each other. The words "simultaneous" and "simultaneously" as used herein with respect to processes mean that the processes take place on overlapping intervals of time. For example, if a first process takes place over a first interval of time and a second process takes place simultaneously over a second interval of time, then the first and second intervals of time at least partially overlap each other such that there exists a time at which the first and second processes are both taking place.

In an embodiment, referring to FIGS. 3A and 4B, the cover layer 15 on the chip region 110 may extend to the edge region 120. The cover layer 15 may extend to the inside of the plurality of second slits SLT2 to constitute the gap fill layer GF.

In another embodiment, referring to FIGS. 3A and 4C, an insulating material 18 deposited for the slit insulating layer IS and a conductive material 17 deposited for the source contact SC may be formed inside the plurality of second slits SLT2. As compared with that the source contact SC is formed to fill a central region of the first slit SLT1, the conductive material 17 may be formed to fill only portions of the plurality of second slits SLT2 located in the edge region 120. In an embodiment, the conductive material 17 which is the same as the source contact SC may be formed in lower regions of the plurality of second slits SLT2. Upper regions of the plurality of second slits SLT2, which are opened by the conductive material 17, may be filled with the cover layer 15.

FIGS. 5A to 5D are enlarged views illustrating various arrangements of a plurality of second slits.

FIGS. 5A to 5D are enlarged views of the unit edge region 121 shown in FIG. 2.

Figure 5A:
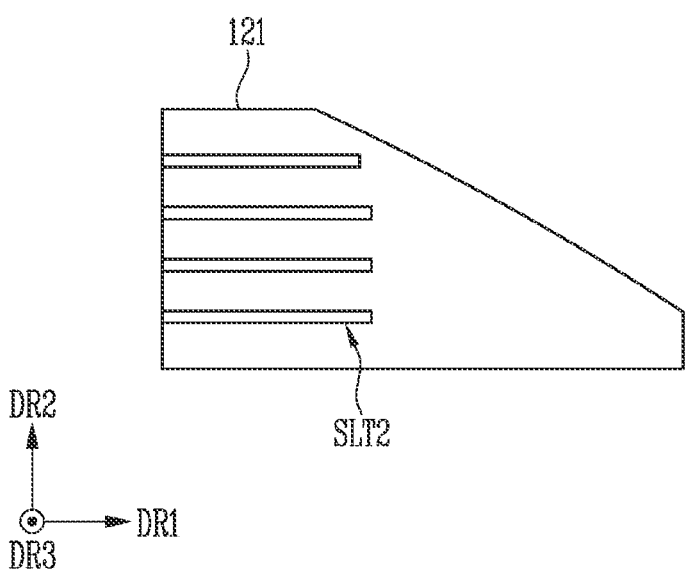
FIGS. 5A, 5B, 5C, and 5D are enlarged views illustrating various arrangements of a plurality of second slits.
Figure 5B:
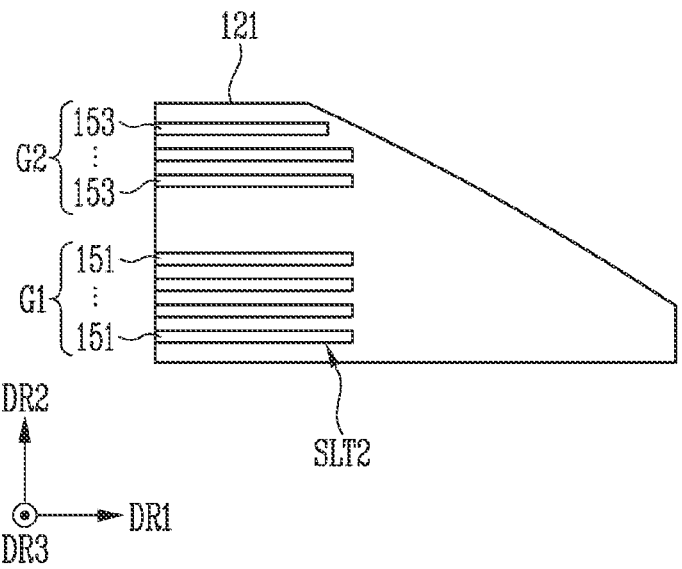

Referring to FIGS. 5A and 5B, a plurality of second slits SLT2 may be disposed on the unit edge region 121. The plurality of second slits SLT2 may be formed in a line shape in which the distance between adjacent ends in the first direction DR1 is greater than the distance between adjacent ends in the second direction DR2. The length of the plurality of second slits SLT2 may be constant in the first direction DR1 or be variously changed. The plurality of second slits SLT2 may surround the chip region 110 shown in FIG. 2 and be disposed to be spaced apart from each other in the second direction DR2 intersecting the first direction DR1. The number of the plurality of second slits SLT2 disposed on the unit edge region 121 is not limited to those shown in the drawings, and the distance at which the plurality of second slits SLT2 are spaced apart from each other may be various. In an embodiment, as shown in FIG. 5A, the plurality of second slits SLT2 may be spaced apart from each other at a constant distance. In another embodiment, as shown in FIG. 5B, the plurality of second slits SLT2 may include a plurality of first sub-slits 151 of a first group G1 and a plurality of second sub-slits 153 of a second group G2. The plurality of first sub-slits 151 and the plurality of second sub-slits 153 may be disposed to surround the chip region 110 shown in FIG. 2, and be formed in a line shape extending in the first direction DR1. The plurality of first sub-slits 151 may be spaced apart from each other at a first distance in the second direction DR2, and the plurality of second sub-slits 153 may be spaced apart from each other at the first distance in the second direction DR2. A first sub-slit 151 and a second sub-slit 153, which are adjacent to each other at a boundary of the first group G1 and the second group G2 may be spaced apart from each other at a second distance in the second direction DR2. The first distance and the second distance, which are described above, may be different from each other.

Figure 5C:
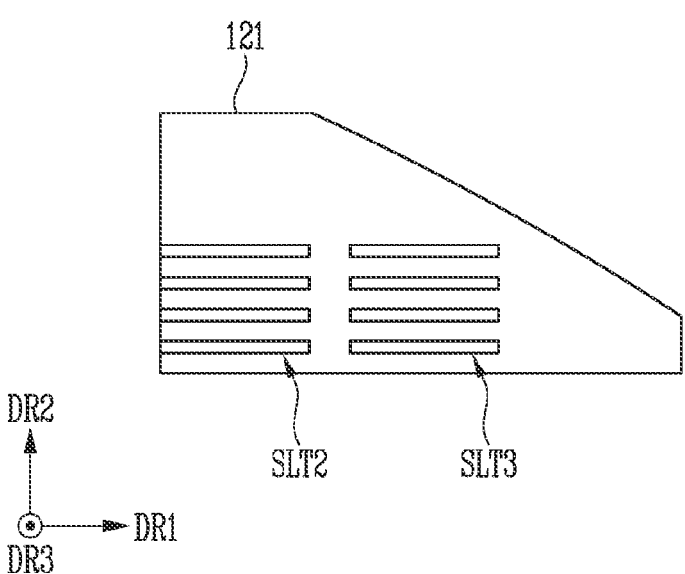
Figure 5D:
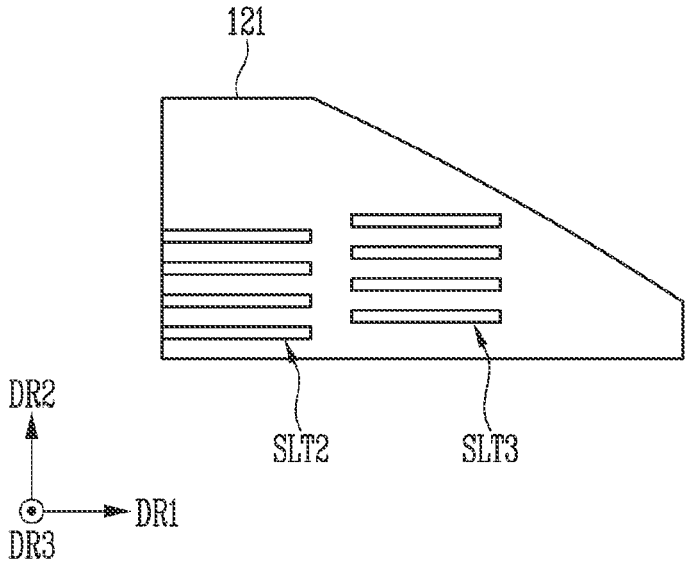

Referring to FIGS. 5C and 5D, a plurality of third slits SLT3 in addition to a plurality of second slits SLT2 may be further disposed on the unit edge region 121. The plurality of second slits SLT2 may be arranged at various distances as described with reference to FIGS. 5A and 5B. The plurality of second slits SLT2 may be disposed between the first slit SLT1 on the chip region 110 shown in FIG. 3A and the plurality of third slits SLT3. The plurality of third slits SLT3 may be formed in a line shape in which the distance between adjacent ends in the first direction DR1 is greater than the distance between adjacent ends in the second direction DR2, and be disposed to be spaced apart from each other in the second direction DR2. Like the plurality of second slits SLT2 described with reference to FIGS. 5A and 5B, the plurality of third slits SLT3 may be disposed to be spaced apart from each other at various distances. The plurality of third slits SLT3 may be aligned in parallel to the plurality of second slits SLT2, or be aligned in zigzag. In an embodiment, as shown in FIG. 5C, the plurality of third slits SLT3 may be adjacent to and spaced apart from the plurality of second slits SLT2 in the first direction DR1. In another embodiment, as shown in FIG. 5D, the plurality of third slits SLT3 may be adjacent to and spaced apart from the plurality of second slits SLT2 in a diagonal direction between the first direction DR1 and the second direction DR2.

The arrangement of the plurality of second slits SLT2 and the plurality of third slits SLT3 may be various, and is not limited to those shown in FIGS. 5A to 5D. The slits disposed on the unit edge region 121 may constitute one column like the plurality of second slits SLT2 shown in FIGS. 5A and 5B, or constitute two columns like the plurality of second slits SLT2 and the plurality of third slits SLT3, which are shown in FIGS. 5C and 5D. However, the embodiments of the present disclosure are not limited thereto. For example, a plurality of fourth slits may be further formed on a column adjacent to the plurality of third slits SLT3. The plurality of fourth slits may be adjacent to the plurality of third slits SLT3 in the first direction DR1, and be adjacent to the plurality of third slits SLT3 in a diagonal direction between the first direction DR1 and the second direction DR2.

Figure 6A:
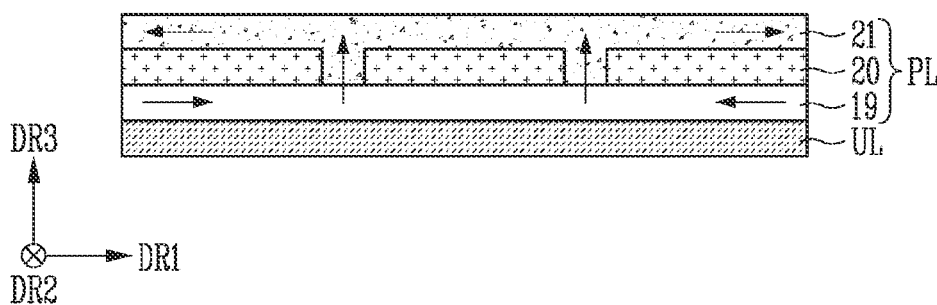
FIGS. 6A and 6B are sectional views illustrating an upper line structure of the present disclosure.
Figure 6B:
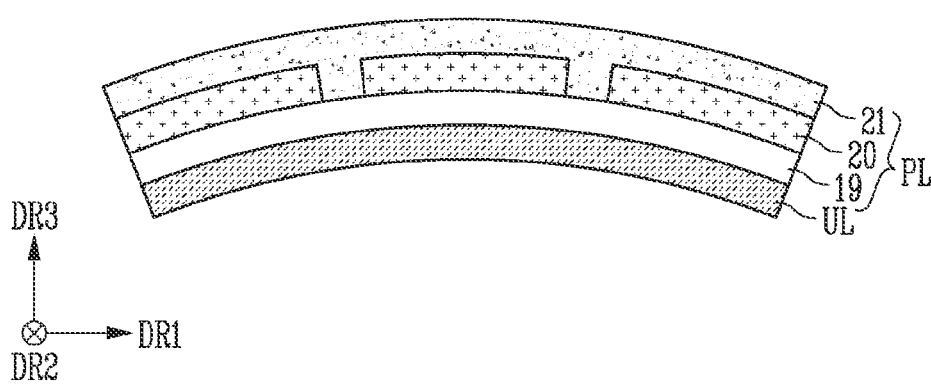

FIGS. 6A and 6B are sectional views illustrating an upper line structure of the present disclosure.

Referring to FIG. 6A, a plurality of protective layers PL may be disposed on the upper line UL. The number of protective layers is not limited to that shown in the drawing. In an embodiment, a first protective layer 19, a second protective layer 20, and a third protective layer 21 may be formed on the upper line UL. Warpage may occur in the wafer due to stress induced by a process of depositing the plurality of protective layers PL formed on the upper line UL and a subsequent annealing process. In an embodiment, as shown in FIG. 6A, stress may act in a direction in which the plurality of protective layers PL are elongated until a process of depositing the first to third protective layers 19, 20, and 21. When the stress acts in the direction in which the plurality of protective layers PL are elongated, as shown in FIG. 6B, warpage may occur in the wafer such that the upper line UL becomes convex in a direction in which the plurality of protective layers PL are viewed. Although not shown in the drawing, when a fourth protective layer is deposited on the first to third protective layers 19, 20, and 21, stress may act in a direction in which the plurality of protective layers PL are contracted. Although not shown in the drawing, the stress may again act in the direction in which the plurality of protective layers PL are elongated due to an annealing process as a process after the protective layers PL are deposited. Therefore, separation or cracks between the upper line UL and the plurality of protective layers PL may occur due to a sudden change in a direction in which the stress acts. In accordance with various embodiments of the present disclosure, the direction in which stress acts is dispersed by a plurality of slits formed in the edge region of the wafer, so that the separation or cracks between the upper line UL and the plurality of protective layers PL can be prevented or mitigated.

FIGS. 7A to 7I are sectional views illustrating a method of manufacturing a memory device taken along the line A-A' shown in FIG. 2 in accordance with an embodiment of the present disclosure. FIGS. 7A to 7I illustrate a structure formed in a chip region.

Figure 7A:
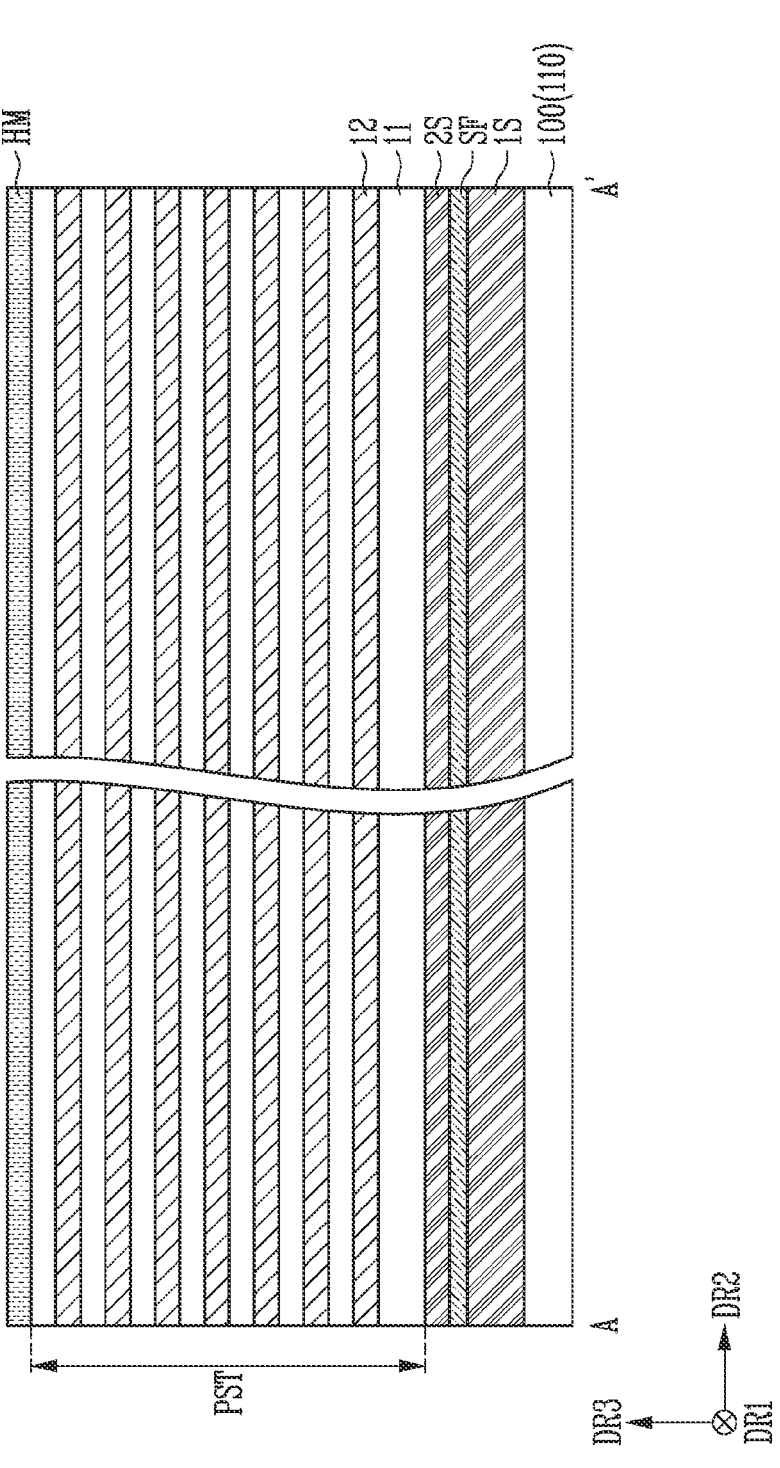

Referring to FIG. 7A, a first source layer 1S, a sacrificial layer SF, and a second source layer 2S may be sequentially stacked over a chip region 110 of a wafer 100. Although not shown in the drawing, before the first source layer 1S is formed, a lower structure (not shown) including peripheral circuits and a lower insulating layer covering the lower structure may be formed over the chip region 110 of the wafer 100.

The first source layer 15 and the second source layer 2S may be used as a source line. The first source layer 1S and the second source layer 2S may be formed of various conductive materials such as a doped semiconductor layer, a metal layer, and a metal silicide layer. In an embodiment, each of the first source layer 1S and the second source layer 2S may include a doped silicon layer. The sacrificial layer SF may be formed of a material which is selectively removed in a subsequent process and has an etch selectivity different from an etch selectivity of the first and second source layers 1S and 2S. In an embodiment, the sacrificial layer SF may include an undoped silicon layer or a nitride layer. Although not shown in the drawing, in order to protect the first and second source layers 1S and 2S in a subsequent process, a buffer layer may be further formed between the first source layer 15 and the sacrificial layer SF and between the second source layer 2S and the sacrificial layer SF. For example, the buffer layer may be formed of an oxide layer.

In an embodiment, although not shown in the drawing, an etch stop pattern buried in the second source layer 2S may be additionally formed so as to prevent over-etching during a subsequent process for forming a first slit. The etch stop pattern may be formed of a conductive material such as tungsten.

Subsequently, a plurality of first material layers 11 and a plurality of second material layers 12 may be alternately stacked over the top of the second source layer 2S. For example, after a first material layer as a first layer among the plurality of first material layers 11 is formed on the second source layer 2S, a second material layer as a first layer among the plurality of second material layers 12 may be formed on the first material layer as the first layer. Subsequently, a first material layer as a second layer among the plurality of first material layers 11 may be formed on the second material layer as the first layer, and a second material layer as a second layer among the plurality of second material layers 12 may be formed on the first material layer as the second layer. Each first material layer 11 may be formed of an insulating material. In an embodiment, the first material layer 11 may be formed of an oxide layer such as a silicon oxide layer. Each second material layer 12 may be formed of a material which can be selectively removed in a subsequent process. That is, the second material layer 12 may be formed of a material having an etch selectivity different from an etch selectivity of the first material layer 11. In an embodiment, the second material layer 12 may be formed of a nitride layer.

The plurality of first material layers 11 and the plurality of second material layers 12 alternately stacked with the plurality of first material layers 11 may form a preliminary stack structure PST. The first material layer 11 may be located in each of a lowermost layer and an uppermost layer of the preliminary stack structure PST. A hard mask HM may be formed on the preliminary stack structure PST to cover the preliminary stack structure PST.

Figure 7B:
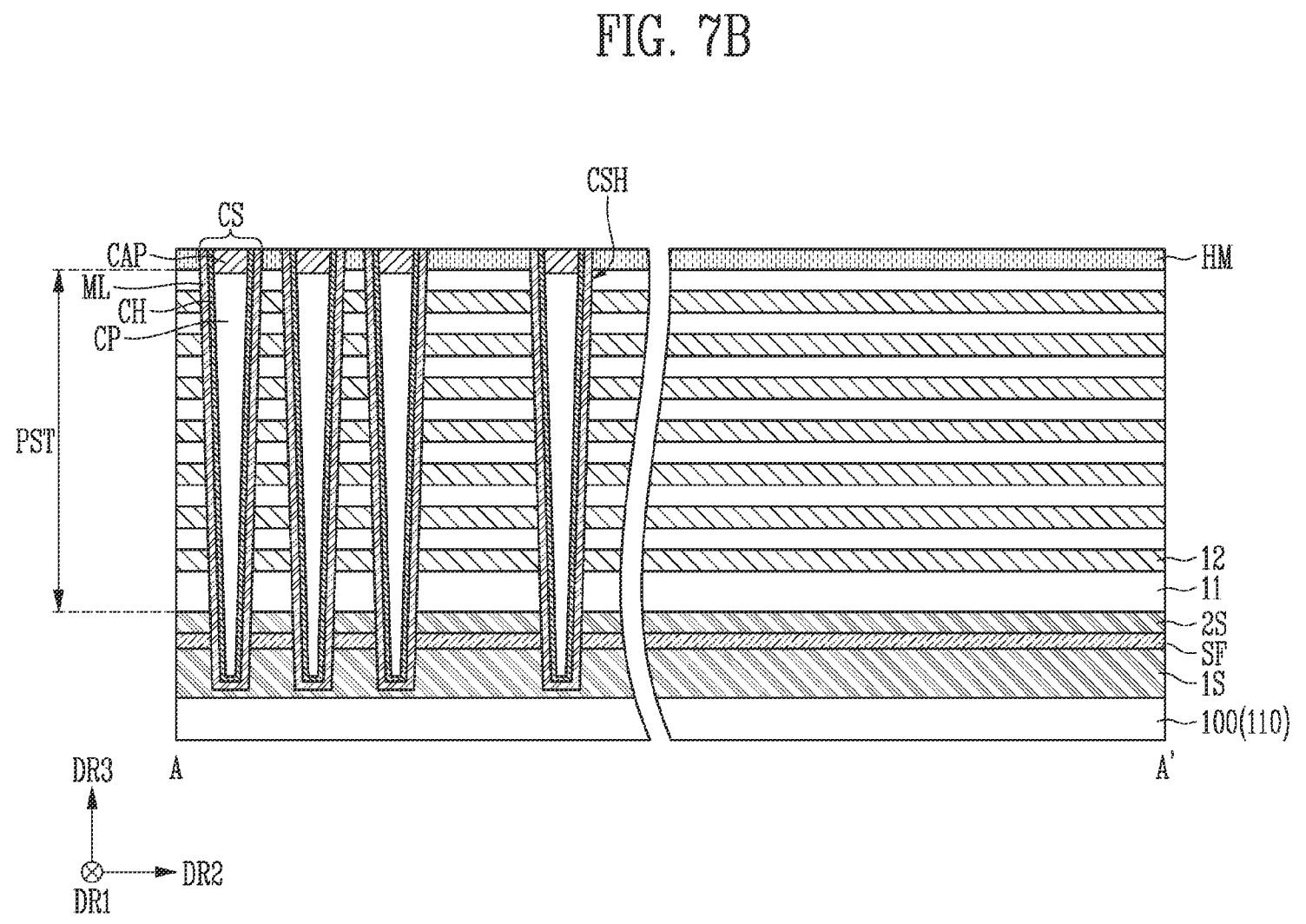

Referring to FIG. 7B, an opening may be formed in the hard mask HM. A channel structure hole CSH penetrating the first and second material layers 11 and 12 may be formed inside the preliminary stack structure PST through the opening of the hard mask HM. An etching process for removing portions of the first and second material layers 11 and 12 may be performed so as to form the channel structure hole CSH. The channel structure hole CSH may extend in the third direction DR3 to penetrate the preliminary stack structure PST through the etching process. The channel structure hole CSH may penetrate the second source layer 2S and the sacrificial layer FS, and extend to the inside of the first source layer 1S. To this end, a portion of each of the second source layer 2S, the sacrificial layer FS, and the first source layer 1S may be etched.

The first and second material layers 11 and 12 may be exposed through an inner wall of the channel structure hole CSH. In addition, the second source layer 2S, the sacrificial layer FS, and the first source layer 1S may be exposed through the inner wall of the channel structure hole CSH. The channel structure CS may be formed inside the channel structure hole CSH. Specifically, a memory layer ML may be deposited along the inner wall of the channel structure hole CSH. A channel layer CH may be deposited along an inner wall of the memory layer ML. A core pillar CP and a capping layer CAP may be sequentially formed along an inner wall of the channel layer CH.

Figure 7C:
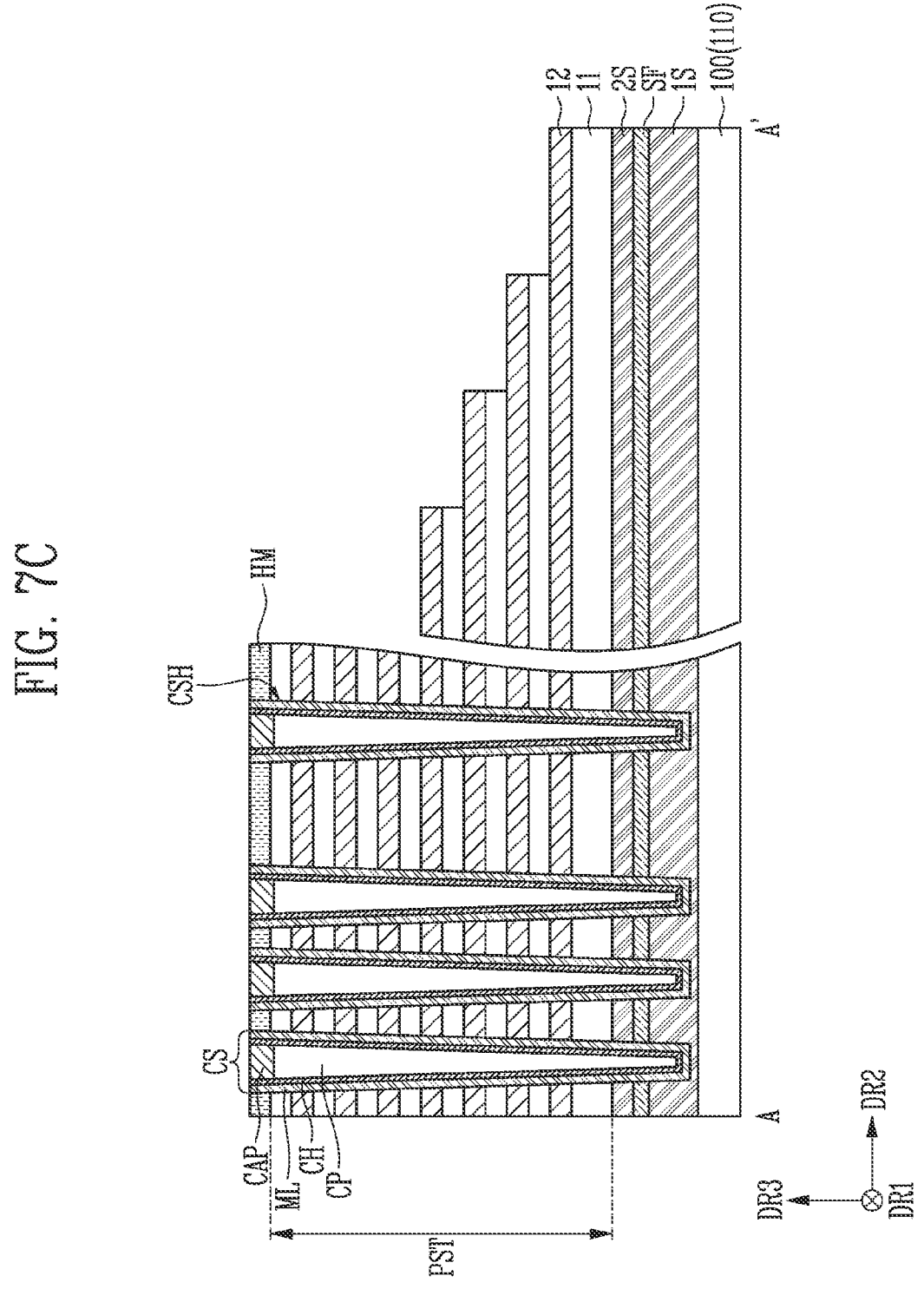

Referring to FIG. 7C, a portion of the preliminary stack structure PST may be etched such that a stepped structure is formed. The stepped structure may be defined by end portions of the first and second material layers 11 and 12 through an etching process. In an embodiment, a top surface of each of the second material layers 12 may be exposed through the stepped structure. In another embodiment, a top surface of each of the first material layers 11 may be exposed through the stepped structure. The end portions of the first and second material layers 11 and 12, which constitute the stepped structure, may be defined as pad parts. For example, each step of the stepped structure includes a pad part including a conductive layer and an insulating layer as shown in FIG. 7C.

Figure 7D:
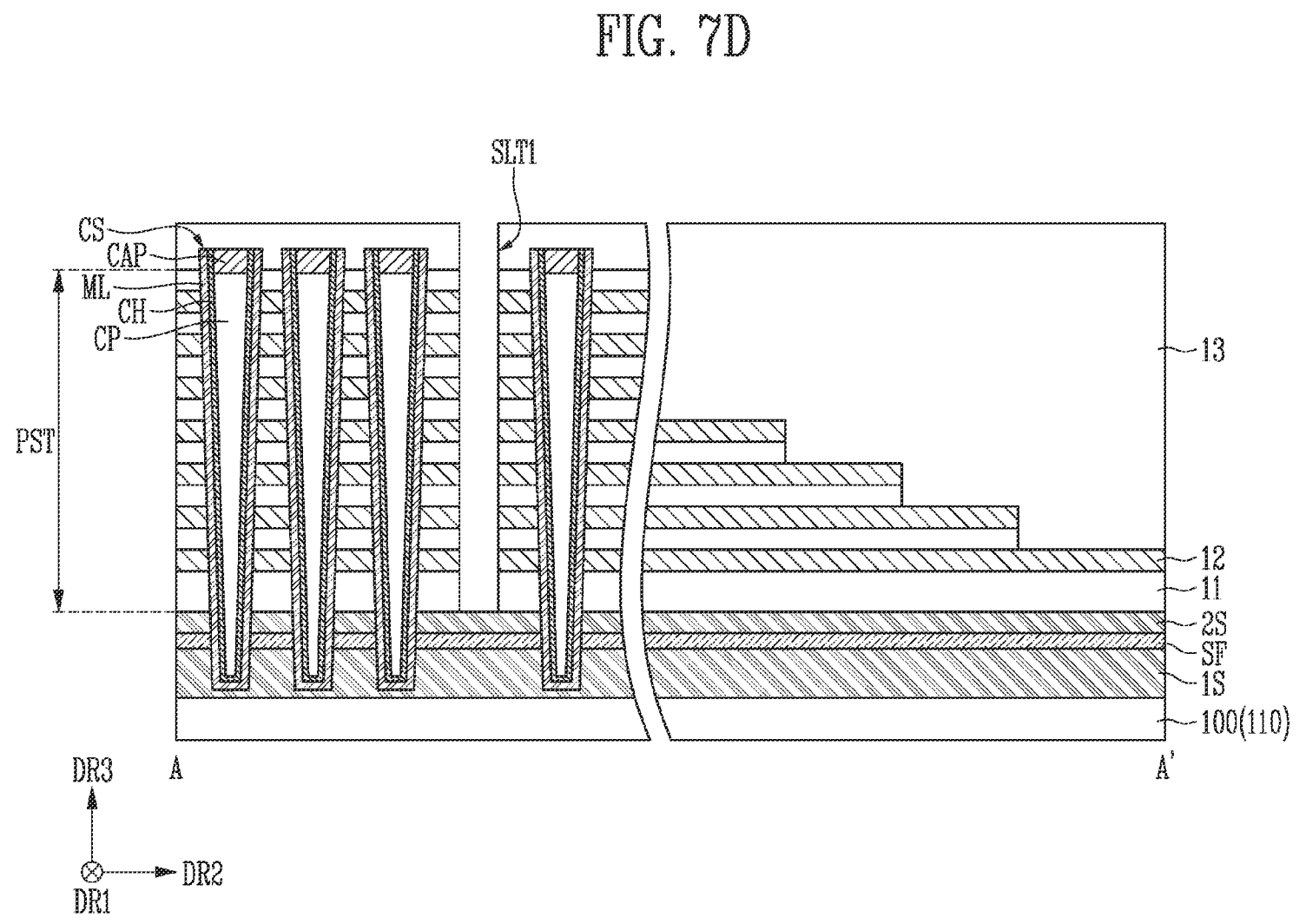

Referring to FIG. 7D, the hard mask HM shown in FIG. 7C, which is formed on the preliminary stack structure PST, may be removed. Subsequently, an upper insulating layer 13 may be formed, which covers the preliminary stack structure PST and the channel structure CS. A plurality of pad parts of the plurality of second material layers 12 may be covered by the upper insulating layer 13. The upper insulating layer 13 may include an insulating material. In an embodiment, the upper insulating layer 13 may include oxide.

Subsequently, a first slit SLT1 may be formed, which penetrates the preliminary stack structure PST and the upper insulating layer 13. The first slit SLT1 may extend in the third direction DR3 in the preliminary stack structure PST and the upper insulating layer 13. The first material layers 11 and the second material layers 12 may be exposed through an inner wall of the first slit SLT1, and the second source layer 2S may be exposed through the bottom of the first slit SLT1. The second source layer 2S may be used as an etch stop layer while the first slit SLT1 is formed. In an embodiment, although not shown in the drawing, an etch stop pattern formed of a metal may be further formed in the second source layer 2S so as to precisely control an etching process while the first slit SLT1 is formed. After the first slit SLT1 is formed such that the etch stop pattern is exposed, the etch stop pattern may be removed.

Figure 7E:
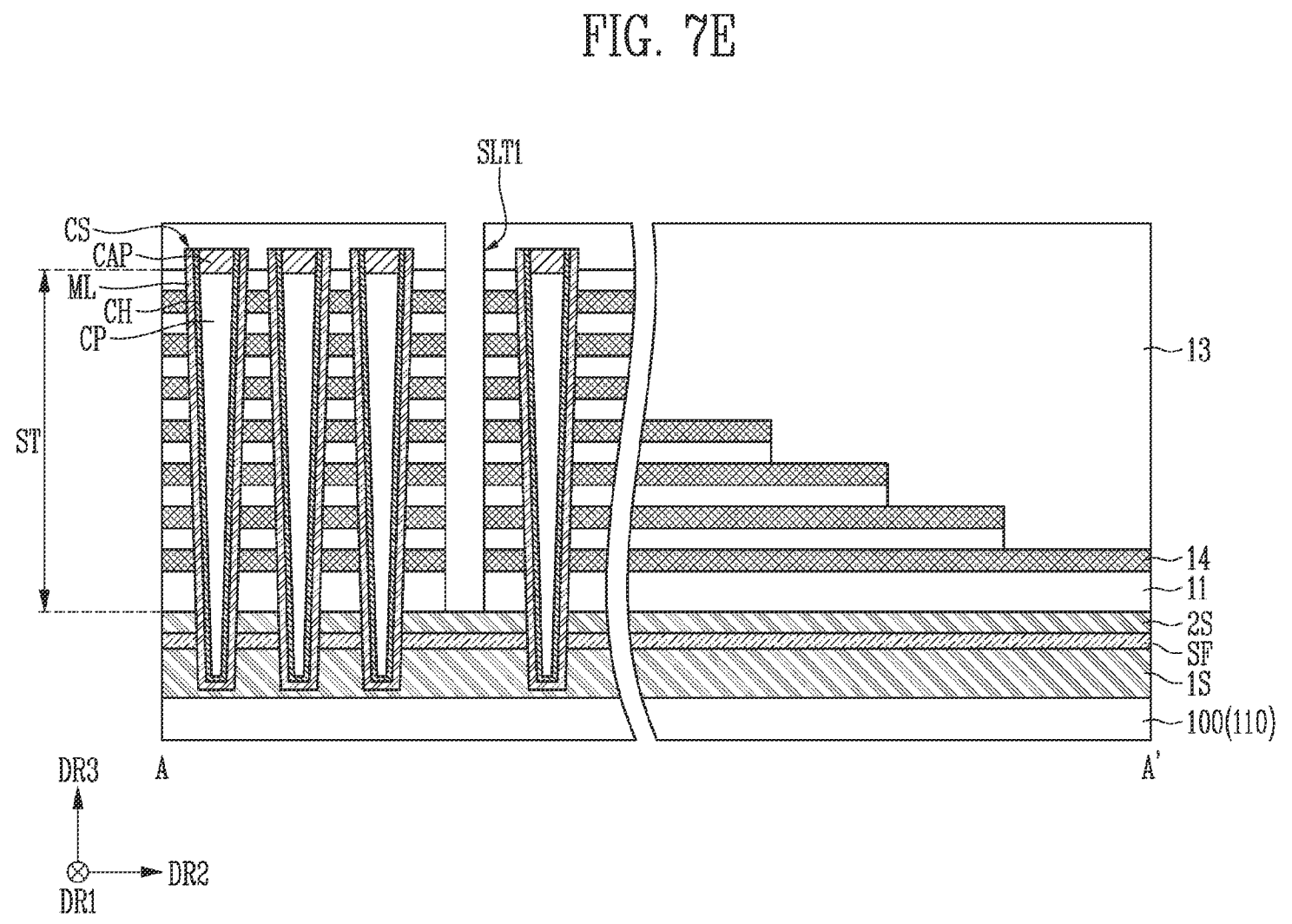

Referring to FIG. 7E, a process of replacing the plurality of second material layers 12 with a plurality of third material layers 14 through the first slit SLT1 may be performed. Specifically, the second material layers 12 shown in FIG. 7D may be removed using an etching process through the first slit SLT1. The etching process through the first slit SLT1 may be performed using an etchant which can allow the first material layers 11 to remain and selectively remove the second material layers 12 shown in FIG. 7D. When the second material layers 12 shown in FIG. 7D are removed, spaces between the first material layers 11 may be opened. The third material layers 14 may be formed in the opened spaces between the first material layers 11. The third material layers 14 may be provided for gate lines such as a drain select line, a source select line, and a word line, and be formed of a conductive material. For example, the third material layers 14 may be formed of tungsten (W), cobalt (Co), nickel (Ni), molybdenum (Mo), silicon (Si), poly-silicon (Poly-Si), and the like.

Figure 7F:
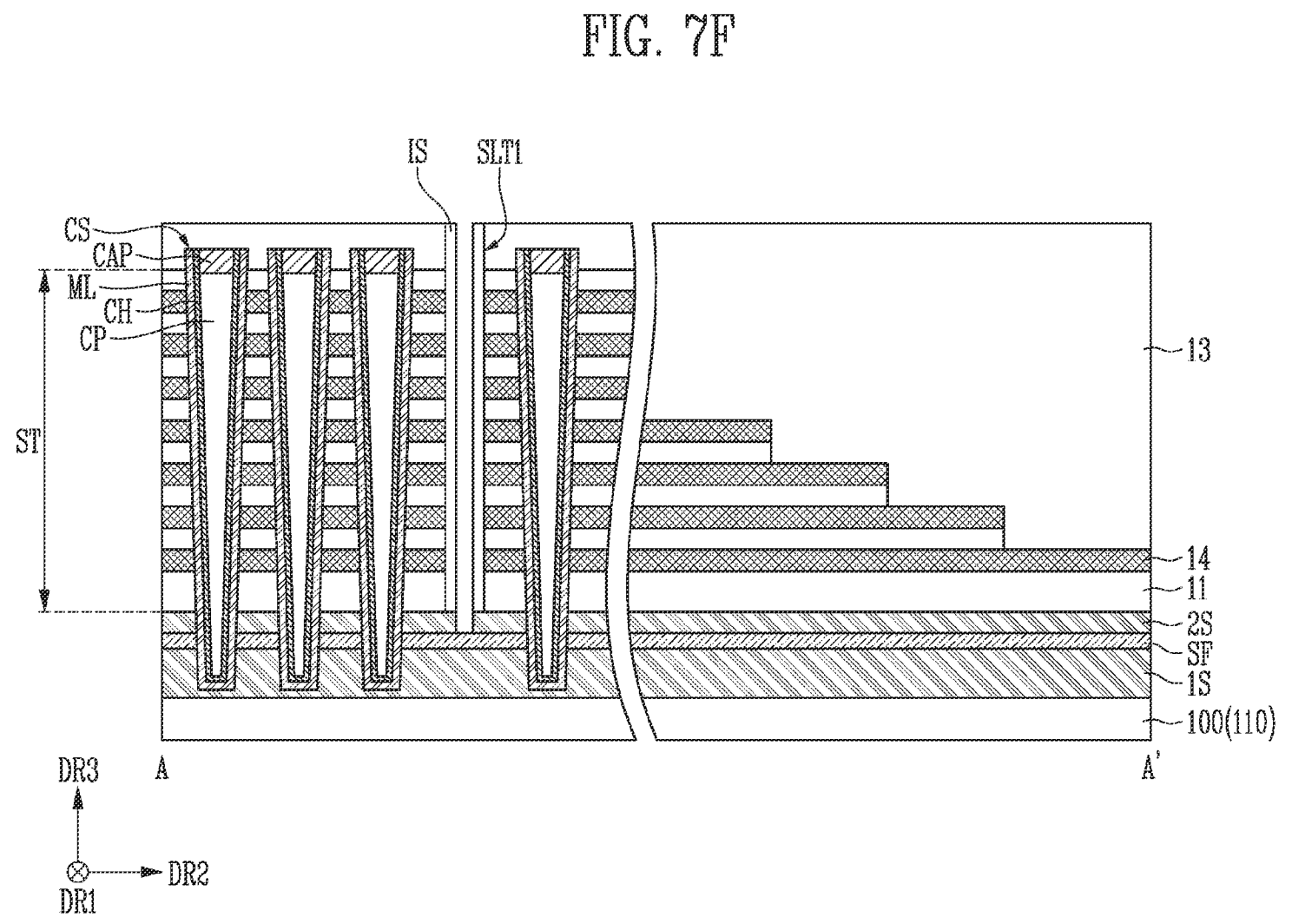

Referring to FIG. 7F, a slit insulating layer IS may be formed in the first slit SLT1. The slit insulating layer IS may extend in the third direction DR3 along the inner wall of the first slit SLT1. Subsequently, a portion of the second source layer 2S may be etched through an opened region of the first slit SLT1 to expose the sacrificial layer SF. The sacrificial layer SF may be exposed through an etched region of the second source layer 2S.

Figure 7G:
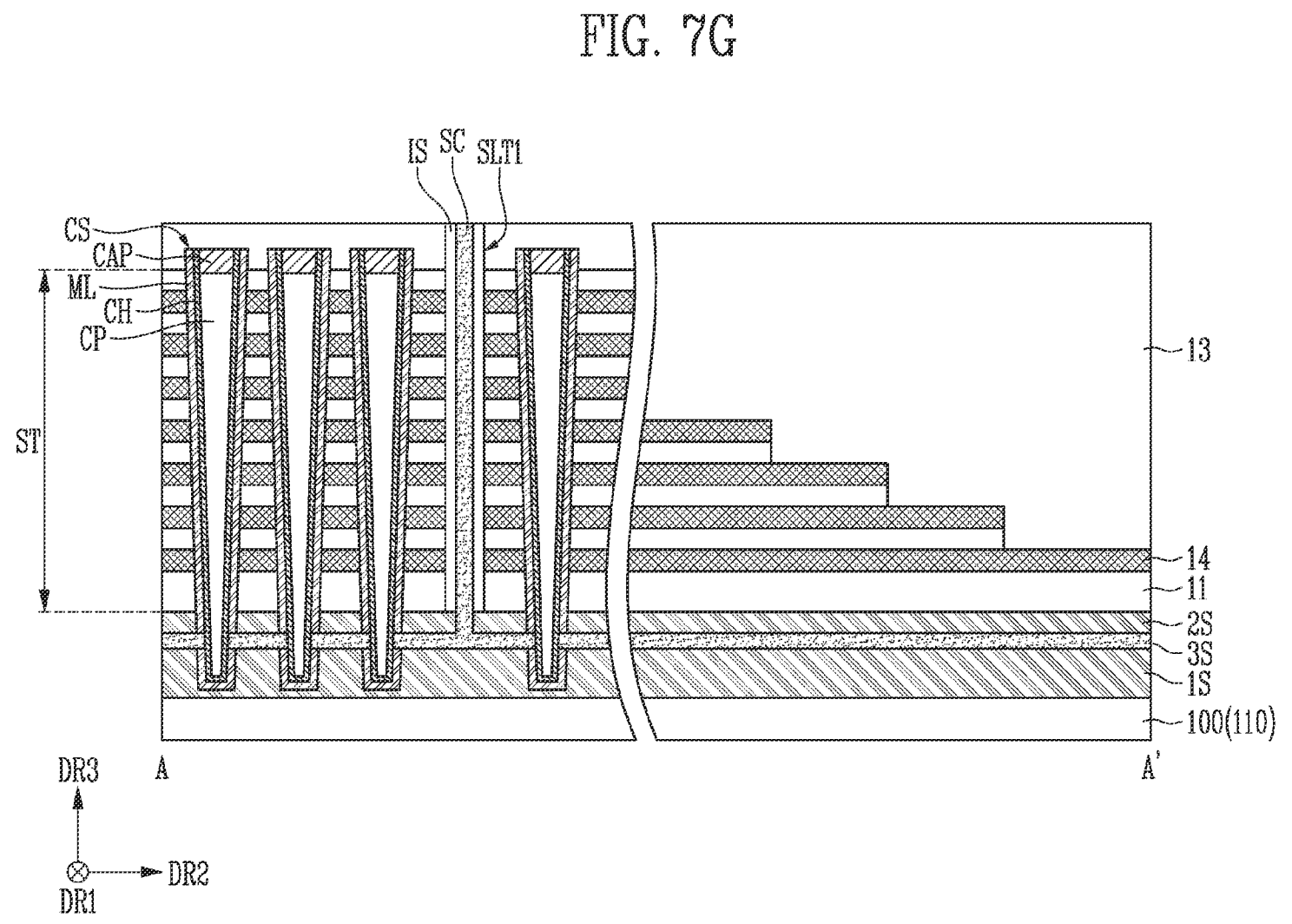

Referring to FIG. 7G, the exposed sacrificial layer SF shown in FIG. 7F may be removed through an etching process. Accordingly, a portion of the memory layer ML shown in FIG. 7F may be exposed. After that, the exposed portion of the memory layer ML may be removed. Accordingly, a partial sidewall of the channel layer CH may be exposed through a space between the second source layer 2S and the first source layer 1S.

Subsequently, a third source layer 3S may be formed in the space between the second source layer 2S and the first source layer 1S. The third source layer 3S may include a doped semiconductor layer including at least one of an n-type impurity and a p-type impurity. In an embodiment, the third source layer 3S may include n-type doped silicon layer. The third source layer 3S may be in contact with the partial sidewall of the channel layer CH. After that, a source contact SC in contact with the third source layer 3S may be formed in the first slit SLT1. The source contact SC may extend in the third direction DR3 along a sidewall of the slit insulating layer IS. The source contact SC may include various conductive materials. For example, the source contact SC may be formed of a conductive material including a doped semiconductor layer such as doped silicon, a metal such as tungsten or nickel, a metal silicide layer such as a titanium nitride layer, and the like. The source contact SC may be formed as a single layer or a layer including at least two layers.

Figure 7H:
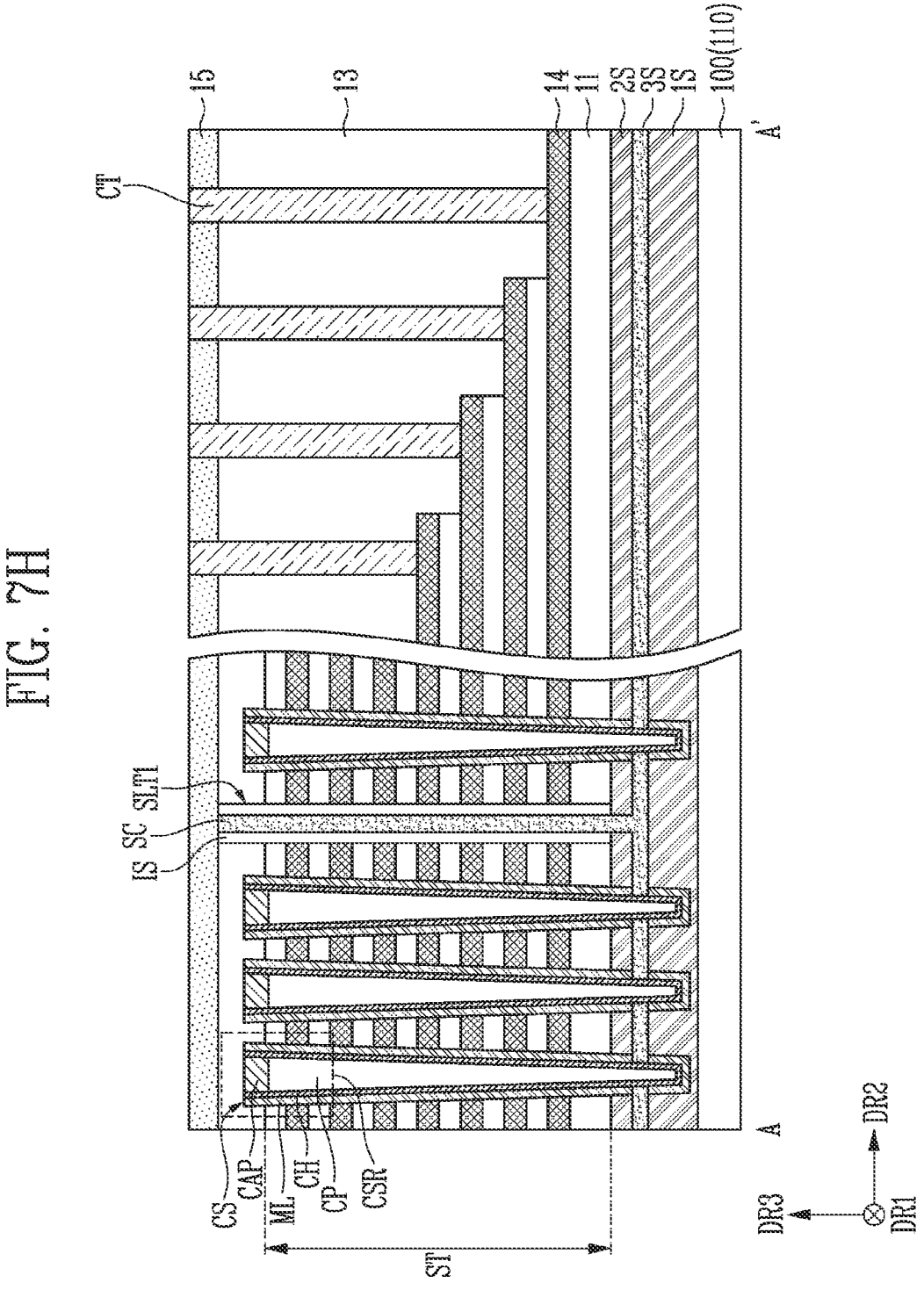

Referring to FIG. 7H, a cover layer 15 may be formed to cover the source contact SC and the upper insulating layer 13. Although not shown in the drawing, an etch stop layer may be further formed before the cover layer 15 is formed. The etch stop layer may be disposed between the cover layer 15 and the upper insulating layer 13. In an embodiment, the etch stop layer may be formed of a nitride layer.

Subsequently, a plurality of contact structures CT may be formed, which penetrate the cover layer 15 and the upper insulating layer 13. The plurality of contact structures CT may be individually connected to the plurality of third material layers 14, and be directly connected to the plurality of third material layers 14. One of the plurality of contact structure CT may be connected to a pad part corresponding thereto among a plurality of pad parts of the plurality of third material layers 14, which constitute the stepped structure.

Figure 7I:
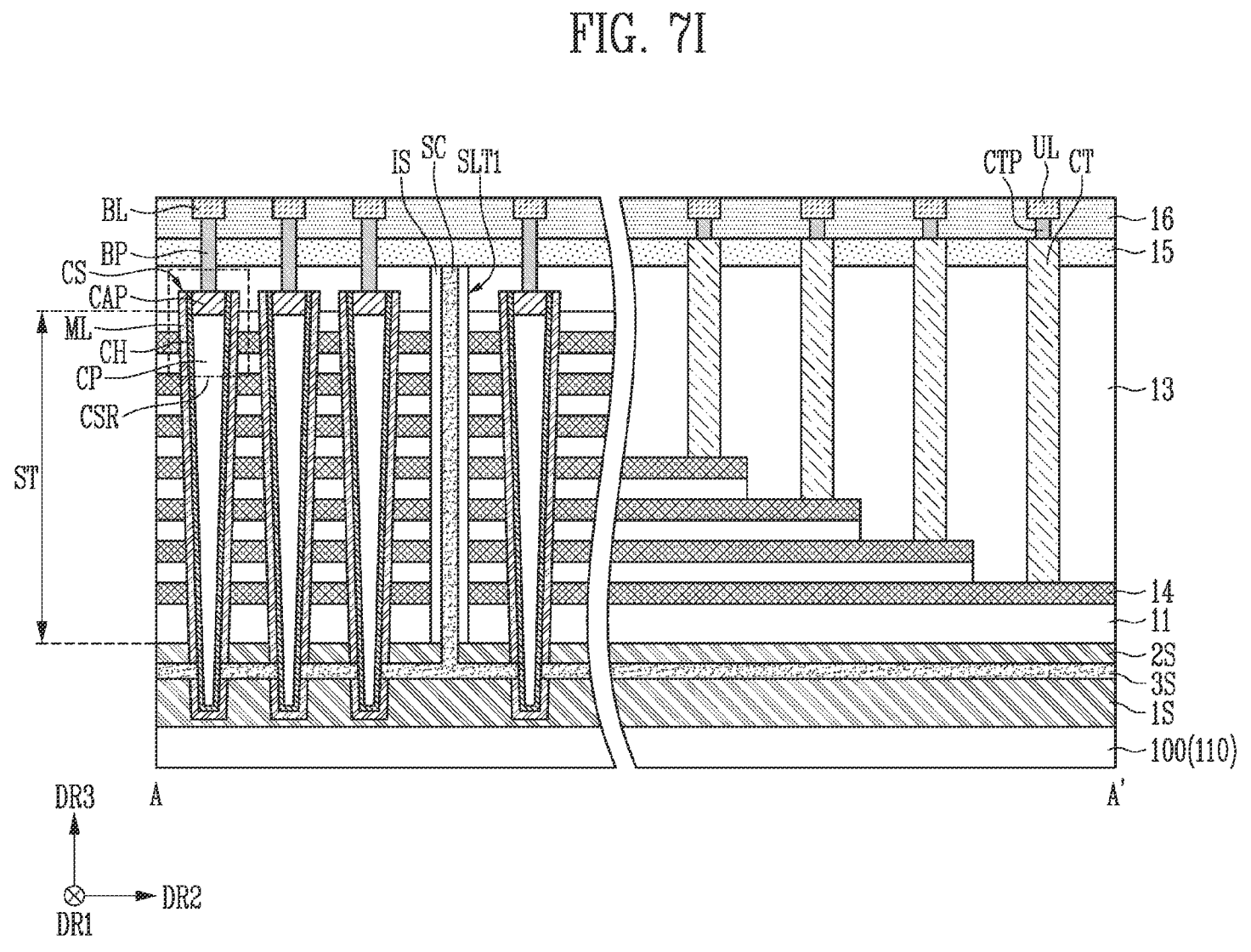

Referring to FIG. 7I, a plurality of contact plugs connected to the plurality of contact structures CT and a plurality of bit line plugs BP connected to the plurality of channel structures CS may be formed. Subsequently, a plurality of upper lines UL connected to the plurality of contact plugs CTP and a plurality of bit lines BL connected to the plurality of bit line plugs BP may be formed. The plurality of contact plugs CTP, the plurality of bit line plugs BP, the plurality of upper lines UL, and the plurality of bit lines BL may be formed through various manufacturing processes.

In an embodiment, the process of forming the plurality of bit line plugs BP and the plurality of contact plugs CTP may include a process of forming a first insulating layer constituting a lower portion of an isolation insulating layer 16 on the cover layer 15, a process of forming a plurality of holes penetrating the first insulating layer, and a process of filling the plurality of holes with a conductive material. In an embodiment, the process of forming the plurality of upper lines UL and the plurality of bit lines BL may include a process of forming a second insulating layer constituting an upper portion of the isolation insulating layer 16 on the first insulating layer of the isolation insulating layer 16, a process of forming a plurality of trenches penetrating the second insulating layer, and a process of filling the plurality of trenches with a conductive material.

Figure 8A:
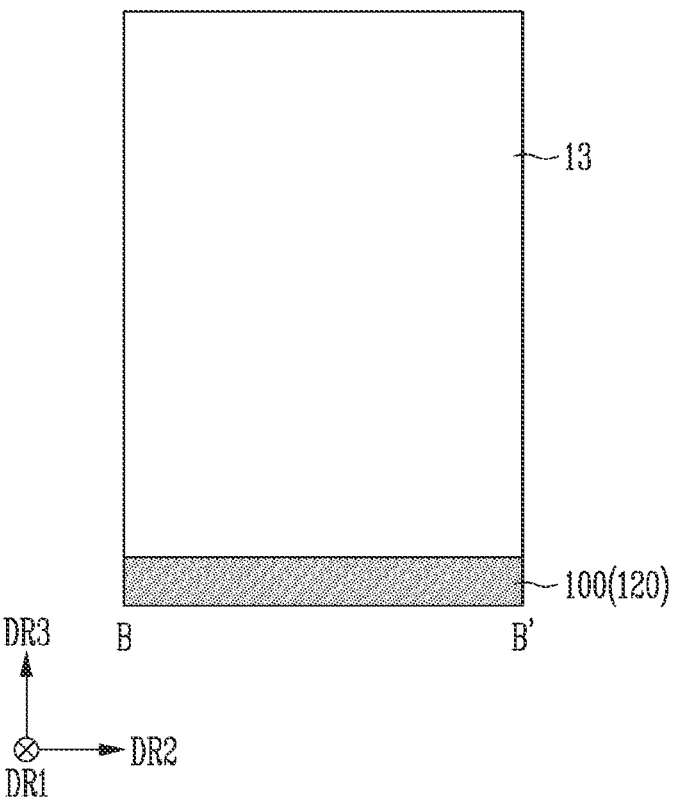
FIGS. 8A, 8B, and 8C are sectional views illustrating a method of manufacturing a memory device taken along the line B-B' shown in FIG. 2 in accordance with an embodiment of the present disclosure.
Figure 8B:
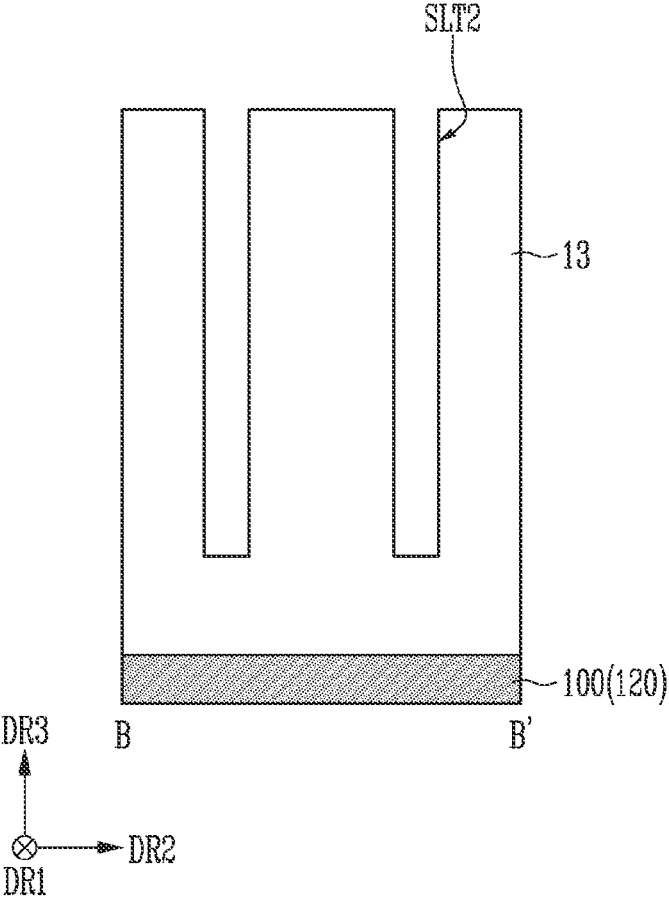
Figure 8C:
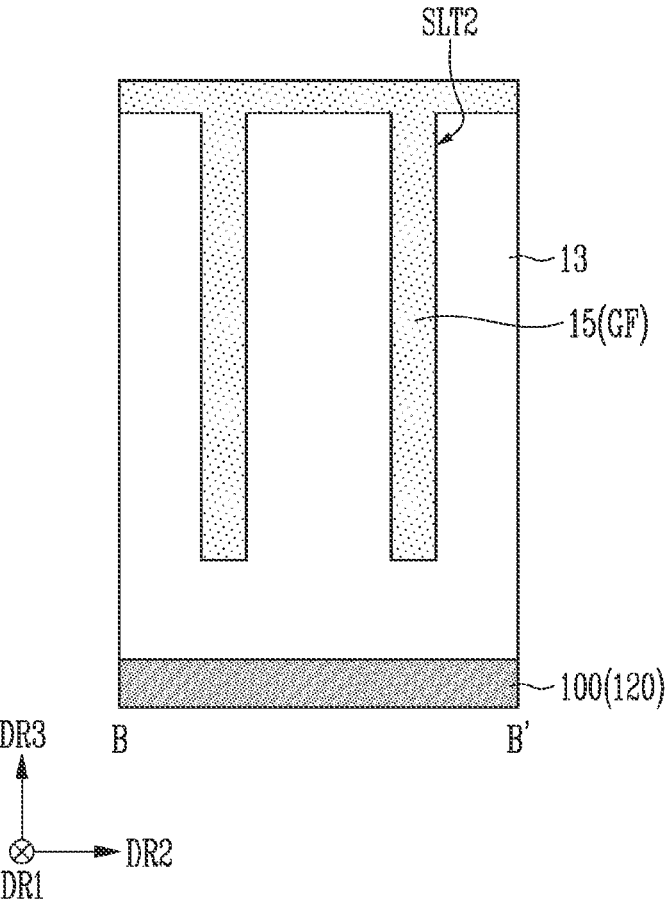

FIGS. 8A to 8C are sectional views illustrating a method of manufacturing a memory device taken along the line B-B' shown in FIG. 2 in accordance with an embodiment of the present disclosure. FIGS. 8A to 8C illustrate a structure formed in an edge region.

Referring to FIGS. 7D and 8A, when the upper insulating layer 13 is formed over the chip region 110 of the wafer 100, the upper insulating layer 13 may extend onto an edge region 120 of the wafer 100.

Referring to FIGS. 7D and 8B, when the first slit SLT1 is formed on the chip region 110 of the wafer 100, a plurality of second slits SLT2 may be formed. The plurality of second slits SLT2 may partially penetrate the upper insulating layer 13 disposed on the edge region 120 of the wafer 100.

In an embodiment, material layers deposited after forming the first slit SLT1 may not completely fill the plurality of second slits SLT2, and the plurality of second slits SLT2 may be fully open or partially open. In an embodiment, the open area of the plurality of second slits SLT2 may be used to reduce stress in a subsequent process.

In another embodiment, the plurality of second slits SLT2 may be filled with a gap fill layer GF as shown in FIG. 8C.

Referring to FIGS. 7H and 8C, when the cover layer 15 is formed over the chip region 110 of the wafer 100, the cover layer 15 may extend onto the edge region 120 of the wafer 100 to fill the inside of the plurality of second slits SLT2. The gap fill layer GF may be configured with the cover layer 15. In an embodiment, the plurality of second slits SLT2 filled with the cover layer 15 may be used to reduce stress in a subsequent process.

In still another embodiment, the gap fill layer GF may include the conductive material 17, the insulating material 18, and the cover layer 15, which are described with reference to FIG. 4C. Referring to FIGS. 4C and 7F, the insulating material 18 may be formed of the same material as the slit insulating layer IS while the slit insulating layer IS is formed on the sidewall of the first slit SLT1, and be formed on sidewalls of the plurality of second slits SLT2. Referring to FIGS. 4C and 7G, the conductive material 17 may be formed of the same material as the source contact SC while the source contact SC is formed inside the first slit SLT1, and be formed in lower regions of the plurality of second slits SLT2. Referring to FIGS. 4C and 7H, the cover layer 15 may extend onto the conductive material 17 to fill upper regions of the plurality of second slits SLT2. In an embodiment, the plurality of second slits SLT2 filled with the conductive material 17, the insulating material 18, and the cover layer 15 may be used to reduce stress in a subsequent process.

When the plurality of third slits SLT3 as shown in FIGS. 5C and 5D in addition to the plurality of second slits SLT2 are to be further formed on the edge region 120 of the wafer 100, the plurality of third slits SLT3 may be simultaneously formed with the first slit SLT1 described with reference to FIG. 7E during a process of forming the first slit SLT1. Like the plurality of second slits SLT2 shown in FIGS. 4A and 8A, the plurality of third slits SLT3 shown in FIGS. 5C and 5D may remain in a state in which the plurality of third slits SLT3 are opened, thereby being used to reduce stress in a subsequent process. Alternatively, in an embodiment, like the plurality of second slits SLT2 shown in FIGS. 4B and 8B, the plurality of third slits SLT3 shown in FIGS. 5C and

5D may be used to reduce stress in a subsequent process in a state in which the plurality of third slits SLT3 are filled with the gap fill layer configured with the cover layer 15. Alternatively, in an embodiment, like the plurality of second slits SLT2 shown in FIG. 4C, the plurality of third slits SLT3 shown in FIGS. 5C and 5D may be used to reduce stress in a subsequent process in a state in which the plurality of third slits SLT3 are filled with the conductive material 17, the insulating material 18, and the cover layer 15.

Figure 9:
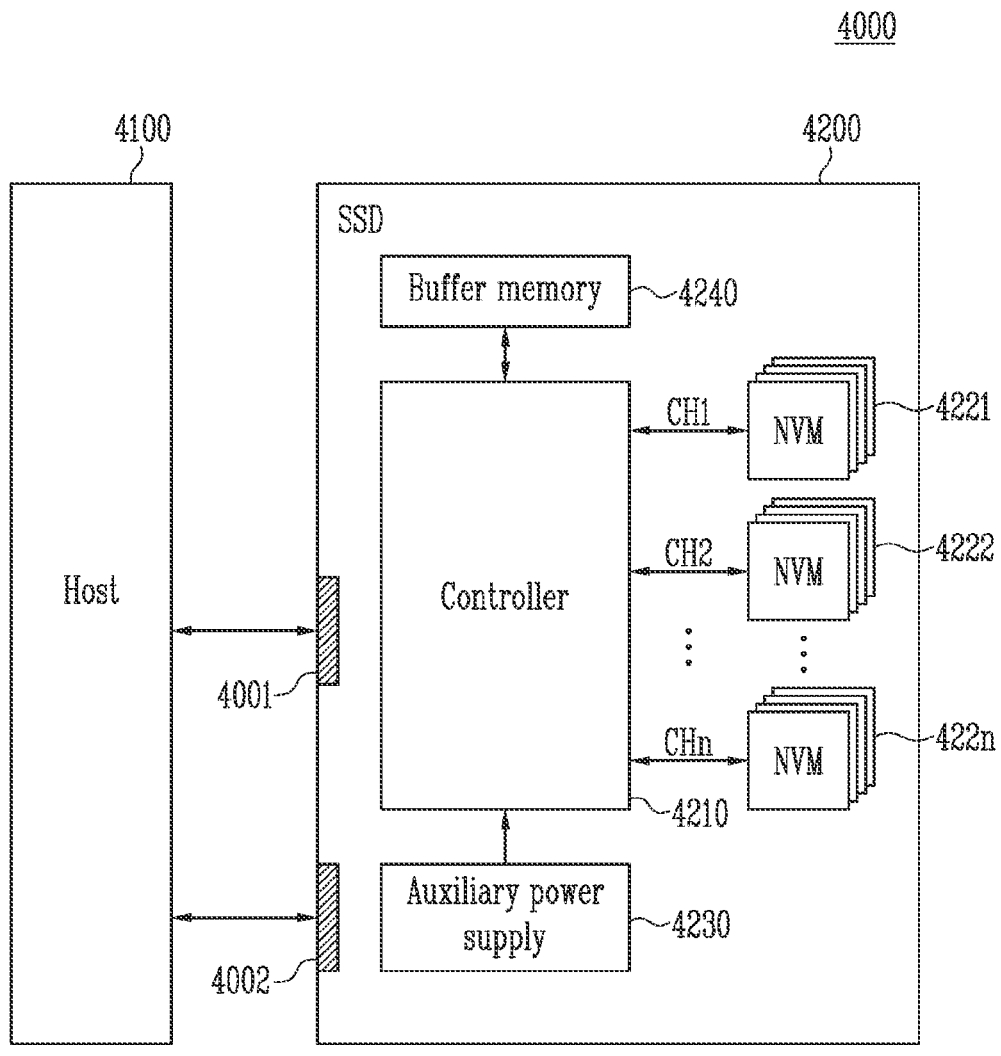
FIG. 9 is a diagram illustrating a Solid State Drive (SSD) system to which the memory device of the present disclosure is applied.

FIG. 9 is a diagram illustrating a Solid State Drive (SSD) system to which the memory device of the present disclosure is applied.

Referring to FIG. 9, the SSD system 4000 includes a host 4100 and an SSD 4200. The SSD 4200 may exchange a signal with the host 4100 through a signal connector 4001, and be supplied with power through a power connector 4002. The SSD 4200 includes a controller 4210, a plurality of memory devices 4221 to 422n, an auxiliary power supply 4230, and a buffer memory 4240.

The controller 4210 may control the plurality of memory devices 4221 to 422n in response to a signal received from the host 4100. Exemplarily, the signal may be transmitted based on an interface between the host 4100 and the SSD 4200. For example, the signal may be defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The plurality of memory devices 4221 to 422n may include a plurality of memory cells configured to store data. Each of the plurality of memory devices 4221 to 422n may be configured identically to the memory device shown in FIG. 3A. The plurality of memory devices 4221 to 422n may communicate with the controller 4210 through channels CH1 to CHn.

The auxiliary power supply 4230 may be connected to the host 4100 through the power connector 4002. The auxiliary power supply 4230 may receive power input from the host 4100 and charge the power. When the supply of power from the host 4100 is not smooth, the auxiliary power supply 4230 may provide power of the SSD 4200. For example, the auxiliary power supply 4230 may be located in the SSD 4200, or be located at the outside of the SSD 4200. For example, the auxiliary power supply 4230 may be located on a main board, and provide auxiliary power to the SSD 4200.

The buffer memory 4240 may be used as a buffer memory of the SSD 4200. For example, the buffer memory 4240 may temporarily store data received from the host 4100 or data received from the plurality of memory devices 4221 to 422n, or temporarily store meta data (e.g., a mapping table) of the plurality of memory devices 4221 to 422n. The buffer memory 4240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 10:
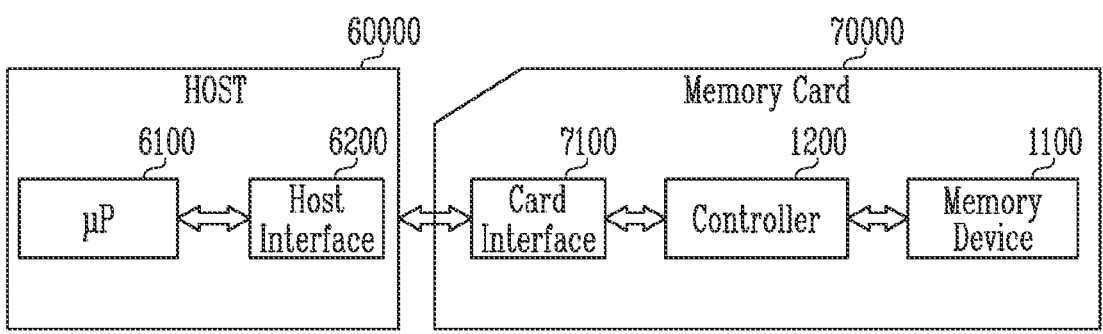
FIG. 10 is a diagram illustrating a memory card system to which the memory device of the present disclosure is applied.

FIG. 10 is a diagram illustrating a memory card system to which the memory device of the present disclosure is applied.

Referring to FIG. 10, the memory system 70000 may be implemented as a memory card or a smart card. The memory system 70000 may include a memory device 1100, a controller 1200, and a card interface 7100.

The controller 1200 may control data exchange between the memory device 1100 and the card interface 7100. The memory device 1100 may be configured identically to the memory device shown in FIG. 3A. In some embodiments, the card interface 7100 may be a secure digital (SD) card interface or a multi-media card (MMC) interface, but the present disclosure is not limited thereto.

The card interface 7100 may interface data exchange between a host 60000 and the controller 1200 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is connected to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the controller 1200 under the control of a microprocessor (μP) 6100.

In accordance with an embodiment of the present disclosure, warpage of a wafer is suppressed, thereby improving the operational characteristic and reliability of the semiconductor device.

What is claimed is:

1. A memory device comprising:
a wafer including a chip region and an edge region surrounding the chip region;
a stack structure including a plurality of insulating layers and a plurality of conductive layers, which are alternately stacked over the chip region;
a plurality of channel structures disposed in the stack structure;
a first slit penetrating the plurality of insulating layers and the plurality of conductive layers;
an upper insulating layer disposed over the edge region;
a plurality of second slits formed in a portion of the upper insulating layer, and
a plurality of third slits formed in a portion of the upper insulating layer,
wherein the plurality of second slits are located between the plurality of third slits and the first slit.

2. The memory device of claim 1,
wherein the plurality of second slits surround the chip region, and
wherein the plurality of second slits are spaced apart from each other.

3. The memory device of claim 1,
wherein the plurality of second slits and the plurality of third slits are formed in substantially a line shape extending in a first direction,
wherein the plurality of second slits are arranged in a second direction intersecting the first direction, and
wherein the plurality of third slits are arranged in the second direction.

4. The memory device of claim 3,
wherein the plurality of third slits are spaced apart from the plurality of second slits in the first direction.

5. The memory device of claim 3,
wherein the plurality of third slits are spaced apart from the plurality of second slits in a diagonal direction between the first direction and the second direction.

6. The memory device of claim 1, further comprising a gap fill layer disposed in the plurality of second slits,
wherein the gap fill layer includes at least one of a conductive material and an insulating material.

7. A memory device comprising:
a wafer including a chip region and an edge region surrounding the chip region;
a stack structure including a plurality of conductive layers and a plurality of insulating layers, which are alternately stacked over the chip region of the wafer,
wherein the stack structure includes a stepped structure comprising end portions of the conductive layers and insulating layers, and
wherein each step of the stepped structure includes a pad part including a conductive layer from the plurality of conductive layers and an insulating layer from the plurality insulating layers;
a plurality of channel structures disposed in the stack structure;
an upper insulating layer formed over the stack structure to cover the stepped structure, the upper insulating layer extending onto the edge region of the wafer;
a plurality of contact structures in contact with the plurality of pad parts while being formed in a portion of the upper insulating layer overlapping with the plurality of pad parts; and
a slit formed in a portion of the upper insulating layer, the slit overlapping with the edge region of the wafer.

8. The memory device of claim 7, further comprising a gap fill layer inside the slit,
wherein the gap fill layer includes at least one of a conductive material and an insulating material.

* * * * *